(12) United States Patent
Nagai et al.

(10) Patent No.: US 7,982,254 B2
(45) Date of Patent: Jul. 19, 2011

(54) SEMICONDUCTOR DEVICE AND METHOD OF FABRICATING THE SAME

(75) Inventors: Kouichi Nagai, Kawasaki (JP); Katsuhiro Sato, Kawasaki (JP); Kaoru Sugawara, Kawasaki (JP); Makoto Takahashi, Kawasaki (JP); Masahito Kudou, Kawasaki (JP); Kazuhiro Asai, Kawasaki (JP); Yukimasa Miyazaki, Kawasaki (JP); Kaoru Saigoh, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 393 days.

(21) Appl. No.: 11/969,019

(22) Filed: Jan. 3, 2008

(65) Prior Publication Data

US 2008/0099855 A1    May 1, 2008

Related U.S. Application Data

(63) Continuation of application No. PCT/JP2005/012314, filed on Jul. 4, 2005.

(51) Int. Cl.
*H01L 29/76* (2006.01)

(52) U.S. Cl. .................. 257/306; 438/396; 257/E29.343

(58) Field of Classification Search .......... 438/396–399, 438/686; 257/306–309, E29.433
See application file for complete search history.

(56) References Cited

U.S. PATENT DOCUMENTS

| | | | |
|---|---|---|---|
| 5,438,023 A * | 8/1995 | Argos et al. ................ 438/3 |
| 5,523,595 A | 6/1996 | Takenaka et al. | |
| 5,760,433 A * | 6/1998 | Ramer et al. ................ 257/295 |
| 6,495,879 B1 * | 12/2002 | Kobayashi .................. 257/310 |
| 2001/0012698 A1 * | 8/2001 | Hayashi et al. ............. 438/782 |
| 2003/0052339 A1 * | 3/2003 | Harada et al. ............... 257/200 |
| 2003/0119321 A1 * | 6/2003 | Uhlenbrock et al. ........ 438/692 |
| 2004/0191930 A1 * | 9/2004 | Son et al. ..................... 438/3 |
| 2005/0070031 A1 * | 3/2005 | Imai et al. ................... 438/3 |

FOREIGN PATENT DOCUMENTS

| | | |
|---|---|---|
| JP | 54-139469 A | 10/1979 |
| JP | 62-32636 A | 2/1987 |

(Continued)

OTHER PUBLICATIONS

International Search Report of PCT/JP2005/012314, date of mailing Oct. 11, 2005.

(Continued)

*Primary Examiner* — Matthew W Such
*Assistant Examiner* — Ali Naraghi
(74) *Attorney, Agent, or Firm* — Fujitsu Patent Center

(57) ABSTRACT

A protective film (56) having a water/hydrogen blocking function is formed so as to cover the periphery of a pad electrode (54a) while being electrically isolated from the pad electrode. A material selected in the embodiment for composing the protective film is a highly moisture-proof material having a water/hydrogen blocking function considerably superior to that of the insulating material, such as palladium (Pd) or palladium-containing material, and iridium (Ir) or iridium oxide ($IrO_x$: typically x=2) or an iridium- or iridium oxide-containing material. An FeRAM capable of reliably preventing water/hydrogen from entering inside, and of maintaining high performance of the ferroelectric capacitor structure (30) may be realized only by a simple configuration.

14 Claims, 22 Drawing Sheets

FOREIGN PATENT DOCUMENTS

| | | |
|---|---|---|
| JP | 1-253940 A | 10/1989 |
| JP | 2-165646 A | 6/1990 |
| JP | 4-102367 A | 4/1992 |
| JP | 6-69270 A | 3/1994 |
| JP | 8-55850 A | 2/1996 |
| JP | 10-92817 A | 4/1998 |
| JP | 2003-282830 A | 10/2003 |
| JP | 2005-515632 A | 5/2005 |
| JP | 2005-175204 A | 6/2005 |

OTHER PUBLICATIONS

Notification of Transmittal of Translation of the International Preliminary Report on Patentability (Form PCT/IB/338) of International Application No. PCT/JP2005/012314 mailing date Jan. 17, 2008 with Forms PCT/IB/373 and English translation form PCT/ISA/237.

Chinese Office Action dated Jun. 5, 2009, issued in corresponding Chinese Patent Application No. 200580050942.X.

\* cited by examiner

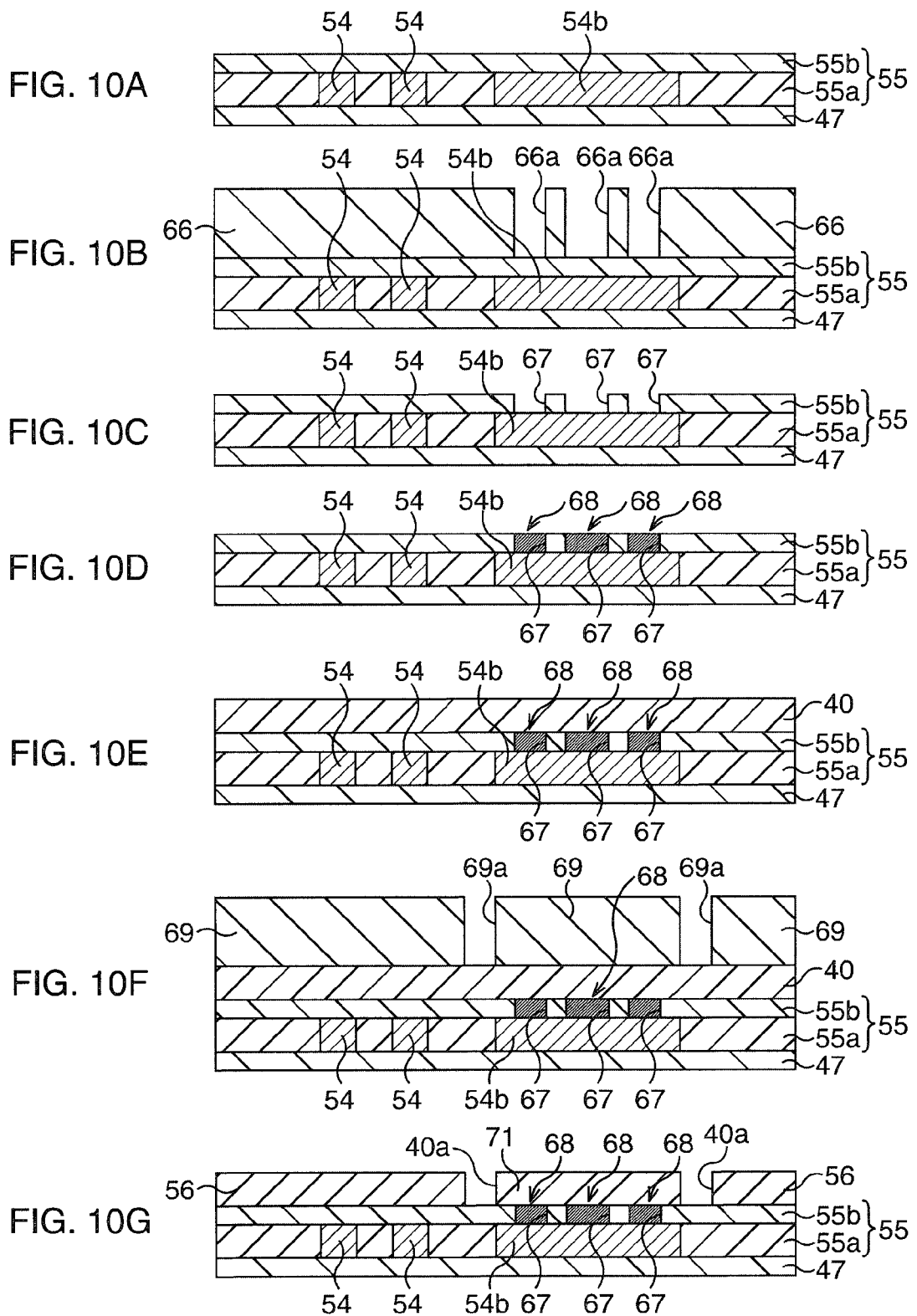

SEMICONDUCTOR DEVICE AND METHOD OF FABRICATING THE SAME

TECHNICAL FIELD

The present embodiment relates to a semiconductor device having a capacitor structure having a dielectric film held between a lower electrode and an upper electrode, and a method of fabricating the same, which is particularly preferable as being adopted to a semiconductor device having a ferroelectric capacitor structure in which the dielectric film is a ferroelectric film having a ferroelectric characteristic.

BACKGROUND ART

In recent years, ferroelectric random access memory (FeRAM) capable of keeping information in a ferroelectric capacitor structure making use of ferroelectric domain inversion has been developed. The ferroelectric random access memory is a non-volatile memory capable of keeping information unerased even if power supply is interrupted, and attracts much attention with expectations of realizing high degree of integration, high-speed operation, high durability and low power consumption.

Materials widely used for ferroelectric film composing the ferroelectric capacitor structure includes ferroelectric oxides having perovskitic crystal structure such as PZT (Pb(Zr,Ti)$O_3$) film, SBT (SrBi$_2$Ta2$O_9$) film and so forth, having large residual polarization typically from 10 ($\mu C/cm^2$) to 30 ($\mu C/cm^2$) or around.

[Patent Document 1]
Japanese Patent Application Laid-Open No. H1-253940
[Patent Document 2]
Japanese Patent Application Laid-Open No. S54-139469
[Patent Document 3]
Japanese Patent Application Laid-Open No. S62-32636
[Patent Document 4]
Japanese Patent Application Laid-Open No. H2-165646

SUMMARY

It is an aspect of the embodiments discussed herein to provide a semiconductor device including a semiconductor substrate, a capacitor structure formed over the semiconductor substrate and having a dielectric film held between a lower electrode and an upper electrode, an interconnect structure formed over the capacitor structure and electrically connected to the capacitor structure, and a pad electrode electrically connected to the interconnect structure so as to establish electrical connection with the externals, wherein a protective film composed of a palladium-containing material is formed so as to cover the periphery of the pad electrode, while being electrically isolated from the pad electrode.

These together with other aspects and advantages which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIG. 10A is a schematic drawing showing a method of fabricating an FeRAM of a second embodiment;

FIG. 10B is a schematic drawing showing a method of fabricating an FeRAM of a second embodiment;

FIG. 10C is a schematic drawing showing a method of fabricating an FeRAM of a second embodiment;

FIG. 10D is a schematic drawing showing a method of fabricating an FeRAM of a second embodiment;

FIG. 10E is a schematic drawing showing a method of fabricating an FeRAM of a second embodiment;

FIG. 10F is a schematic drawing showing a method of fabricating an FeRAM of a second embodiment;

FIG. 10G is a schematic drawing showing a method of fabricating an FeRAM of a second embodiment;

DETAILED DESCRIPTION OF THE PREFERRED EMBODIMENTS

Basic Concept of the Invention

Figure 1A:
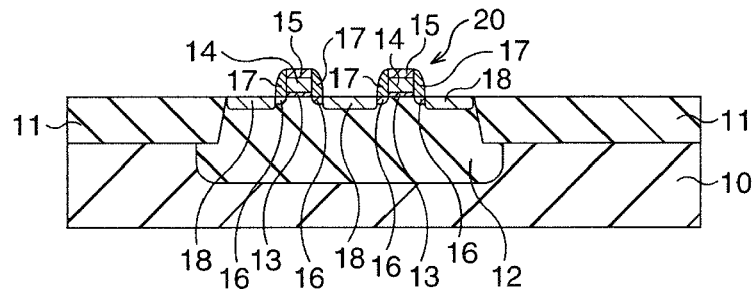
FIG. 1A is a schematic drawing showing a method of fabricating an FeRAM of a first embodiment.

In FeRAM, portions having a largest content of moisture are supposed to be the periphery of pad electrodes. Each pad electrode is formed so as to expose a portion of the surface thereof, in order to establish electrical contact with the externals, allowing water/hydrogen to readily enter inside through the insulating interlayer at the exposed portion, to thereby degrade the ferroelectric film. The present inventors contemplated that an essence of the intrusion of water/hydrogen resides in that the insulating interlayer at around the exposed portions of the pad electrodes, rather than the pad electrodes per se, directly serve as the route of intrusion of water/hydrogen.

In order to block internal intrusion of water/hydrogen at the sites of formation of the insulating interlayer in the embodiment, a protective film having a water/hydrogen blocking function is formed so as to cover the periphery of said pad electrode, while being electrically isolated from said pad electrode. The present inventors extensively investigated into materials for composing the protective film, without limiting their category to insulating materials such as being represented by silicon nitride film having a water blocking function, and finally came to an idea of using a highly waterproof electro-conductive material showing a water/hydrogen blocking function more distinctively than the insulating material, as being exemplified in the embodiment by palladium (Pd) or palladium-containing materials, or iridium (Ir) or iridium oxide ($IrO_x$: typically x=2) or iridium- or iridium-oxide containing materials (simply referred to as "materials of the embodiment, hereinafter).

Palladium (Pd) is a metal capable of occluding hydrogen 935 times as large as its own volume. By forming the protective film using palladium (Pd) so as to cover the periphery of said pad electrode, while being electrically isolated from said pad electrode, most region possibly allowing water/hydrogen to intrude therethrough may be covered by the protective film, so that hydrogen generated based on a catalytic action may certainly be absorbed by the protective film, and intrusion of water/hydrogen into the insulating interlayer laid thereunder may be blocked.

On the other hand, iridium (Ir) or iridium oxide is a metal or an electro-conductive metal oxide intrinsically having a water/hydrogen blocking function. By forming the protective film using iridium (Ir) or iridium oxide so as to cover the periphery of said pad electrode, while being electrically isolated from said pad electrode, most region possibly allowing water/hydrogen to intrude therethrough may be covered by the protective film, so that hydrogen generated based on a catalytic action may certainly be absorbed by the protective film, and intrusion of water/hydrogen into the insulating interlayer laid thereunder may be blocked.

The protective film herein is preferably formed over the entire surface above the semiconductor substrate excluding sites of formation of the pad electrodes, that is, so as to cover not only the memory cell region, but also the peripheral circuit region and the scribing region. By forming the protective film over a wide range, all regions possibly allowing water/hydrogen to intrude therethrough may almost completely be covered by the protective film, and intrusion of water/hydrogen into the underlying insulating interlayer may be minimized as possible.

It is also preferable to form the pad electrodes, together with the protective film, using the same electro-conductive material with the protective film. Because palladium (Pd), iridium (Ir) and iridium oxide are electro-conductive materials, use of these materials also for the pad electrodes allows the pad electrodes to block water/hydrogen, at the same time with the protective film, and thereby high performance of the ferroelectric capacitor structure may be maintained in a more reliable manner. Because the protective film and the pad electrodes in this case may be formed at the same time, by forming a film containing palladium (Pd) or iridium (Ir) or iridium oxide, and then patterning the film, the number of process steps and difference in step height may be reduced.

For the case where the materials of the embodiment are adopted only to the protective film, it is good enough for the protective film to have a thickness just enough for blocking water/hydrogen, typically 20 nm or around, because elector-conductive function is not essential. The film thickness of this level allows etching for patterning to proceed in an easy and exact manner, without using a hard mask or the like.

In particular for the case where the pad electrodes are formed using the same material with the protective film, at the same time with the protective film, it is preferable to form a multi-layered film containing at least one thin film composed of an electro-conductive material containing palladium (Pd) or palladium (Pd) compound, or an electro-conductive material containing iridium (Ir), iridium oxide or electro-conductive material containing these materials (simply referred to as "materials of the embodiment", hereinafter), and then to pattern the multi-layered film to thereby form the protective film and the pad electrodes. In the process of manufacturing a semiconductor memory, it is necessary to bring a probe for functional inspection of the pad electrodes into contact therewith (probe contact). The probe contact may produce a slight contact mark such as scratches on the surface of the pad electrodes. In view of ensuring sufficient levels of electro-conductivity of the pad electrodes and properties of connection with the interconnects, even if they got scratched, it is necessary to form the pad electrodes to a certain degree of thickness, typically to 600 nm to 700 nm or around. On the other hand, only a small thickness of as small as 20 nm or around may be sufficient for the protective film in view of blocking water/hydrogen as described in the above, whereas thickening of the protective film may raise a need of forming a hard mask or the like for the patterning. Therefore, the protective film and the pad electrode are formed as a multi-layered film containing a plurality of electro-conductive layers, and at least one film composed of the materials of the embodiment is formed in the multi-layered film, so as to adjust the total thickness to 1 nm to 20 nm or around.

By virtue of the multi-layered film, the water/hydrogen blocking function may be realized by the electro-conductive materials of the embodiment, and electro-conductivity of the pad electrodes and properties of connection with the interconnects are realized by the other electro-conductive layers. The other electro-conductive layers may be configured by appropriately stacking aluminum (Al) alloy film, titanium (Ti) and titanium nitride films. Because the multi-layered film in this case is not a single-layered film of palladium (Pd), iridium (Ir) or iridium oxide, the protective film and the pad electrodes may be formed by patterning without using a hard mask or the like, even if the multi-layered film is thickened to as much as 20 nm or above.

In addition, it is preferable to form a silicon nitride film above the protective film, so as to cover the inner wall surface of a hole of the pad electrodes. Because the silicon nitride film has a function of blocking intrusion of water to the internal, high performance of the ferroelectric capacitor structure may be maintained in a more reliable manner, by forming the silicon nitride film so as to extend to as far as the inner wall surface of the contact holes, which serve as sites of intrusion of water/hydrogen.

Publicly-known techniques relevant to the embodiment include those described in Patent Documents 1 to 4.

Patent Document 1 discloses a technique of forming a Pd/Ti film on the surface of the pad electrodes, in order to prevent corrosion of the surface of the pad electrodes composed of Al.

Patent Document 2 discloses a technique of composing the pad electrodes as a stacked structure of a plurality of films, and forming a stacked film of Ni—Cu and Pd in the stacked structure.

Patent Document 3 discloses a technique of forming the pad electrodes composed of Al in two layers, while placing a contact hole in between.

Patent Document 4 discloses a technique of using polysilicon which is an electro-conductive nonmetal other than Al, as a material for composing the pad electrodes.

In contrast, aiming at obtaining excellent moisture resistance of a semiconductor memory represented by FeRAM, principal features of the embodiment is to pay attention to the periphery of the pad electrodes, rather than the pad electrodes per se, and to form the protective film composed of the materials of the embodiment over the periphery. The techniques described in Patent Documents 1 and 2 are different from the embodiment, not only in the purpose thereof, but also in that the palladium (Pd) film is applied to none other than but a part of the pad electrodes. Although Patent Document 3 discloses a technique of forming the pad electrodes in two layers, and Patent Document 4 discloses a technique of forming the pad electrodes using an electro-conductive nonmetal other than Al, there is given neither description nor even a minimum suggestion about a technical spirit of forming a film for improving moisture resistance of a semiconductor memory in the periphery of the pad electrodes. Therefore, the embodiment cannot be conceived by combining Patent Documents 1 to 4 anyhow.

SPECIFIC EMBODIMENTS

Paragraphs below will detail specific embodiments applied with the embodiment, referring to the attached drawings. Although the embodiment below will show exemplary cases where the embodiment is applied to FeRAM, the embodiment is applicable also to a semiconductor memory having a capacitor structure applied with a general dielectric film.

First Embodiment

FIG. 1 to FIG. 6 are schematic sectional views sequentially showing configurations of the FeRAM of this embodiment, according to a method of manufacturing the same.

First, as shown in FIG. 1A, a MOS transistor 20, which serves as a selection transistor, is formed on a silicon semiconductor substrate 10.

More details, an element isolation structure 11 is formed typically by the STI (shallow trench isolation) process in the surficial portion of the semiconductor substrate 10, to thereby determine the element activity region.

Next, an impurity, which is B herein, is introduced into the element activity region by ion implantation typically at a dose of $3.0\times10^{13}/cm^2$ and an acceleration energy of 300 keV, to thereby form a well 12.

Next, a gate insulating film 13 of as thin as 3.0 nm is formed on the element activity region typically by thermal oxidation, a polysilicon film of approximately film 180 nm thick and, for example, a silicon nitride film of approximately 29 nm thick are deposited on the gate insulating film 13 by CVD, and the silicon nitride film, the polysilicon film, and the gate insulating film 13 are then patterned by lithography and the succeeding dry etching into a geometry of electrode, to thereby form the gate electrode 14 on the gate insulating film 13. In this process of patterning, a capping film 15 composed of the silicon nitride film is formed on the gate electrode 14 at the same time.

Next, an impurity, which is As herein, is introduced into the element activity region by ion implantation, while using the capping film 15 as a mask, typically at a dose of $5.0\times10^{14}/cm^2$ and an acceleration energy of 10 keV, so as to form so-called LDD regions 16.

Next, a silicon oxide film, for example, is deposited over the entire surface by CVD, and the silicon oxide film is then thinned by so-called etchback process, so as to leave the silicon oxide film only on the side faces of the gate electrode 14 and the capping film 15, to thereby form sidewall insulating films 17.

Next, an impurity, which is P herein, is introduced by ion implantation into the element activity region, while using the capping film 15 and the sidewall insulating film 17 as the masks, under conditions making the impurity concentration higher than that in the LDD regions 16, typically at a dose of $5.0\times10^{14}/cm^2$ and an acceleration energy of 13 keV, to thereby form source-and-drain regions 18 so as to partially overlapped with the LDD regions 16, to thereby complete the MOS transistor 20. It is to be noted that FIG. 1B and any drawings thereafter will not illustrate the silicon semiconductor substrate 10, the well 12, the element isolation structure 11, the LDD regions 16, and source-and-drain regions 18.

Figure 1B:
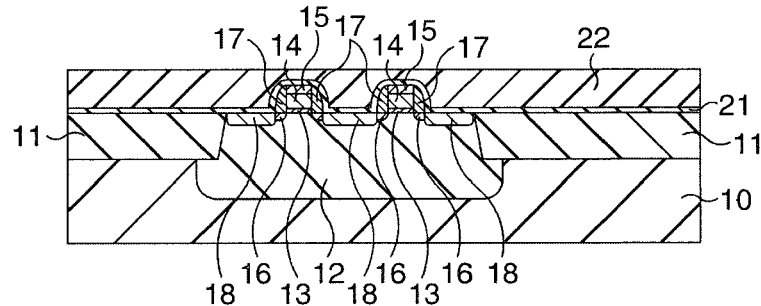
FIG. 1B is a schematic drawing showing a method of fabricating an FeRAM of a first embodiment.

Then, as shown in FIG. 1B, a protective film 21 of the MOS transistor 20 and a first insulating interlayer 22 is formed.

More details, the protective film 21 and the first insulating interlayer 22 are sequentially formed so as to cover the MOS transistor 20. The protective film 21 herein is composed of a silicon oxide film as a material, and is deposited by CVD to a thickness of 20 nm or around. As the first insulating interlayer 22, a stacked structure is formed by sequentially stacking a plasma SiO film (approximately 20 nm thick), a SiN film (approximately 80 nm thick) and a plasma TEOS film (approximately 1000 nm thick), and the stack is polished by CMP until the thickness is reduced to approximately 700 nm.

Figure 1C:
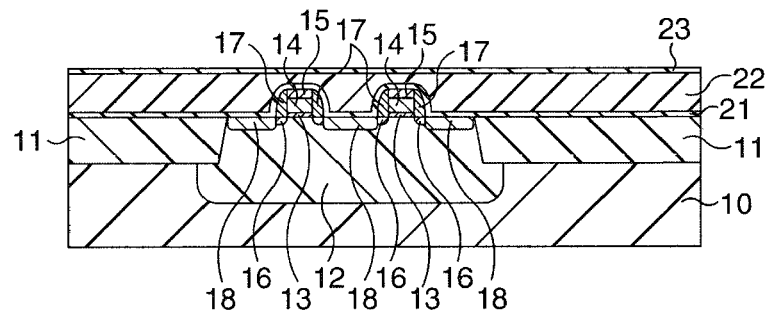
FIG. 1C is a schematic drawing showing a method of fabricating an FeRAM of a first embodiment.

Next, as shown in FIG. 1C, an alignment improving film 23 for the lower electrode of a ferroelectric capacitor structure 30 described later is formed.

More details, the alignment improving film 23 is formed by depositing, for example, a silicon oxide film on the first insulating interlayer 22.

Figure 1D:
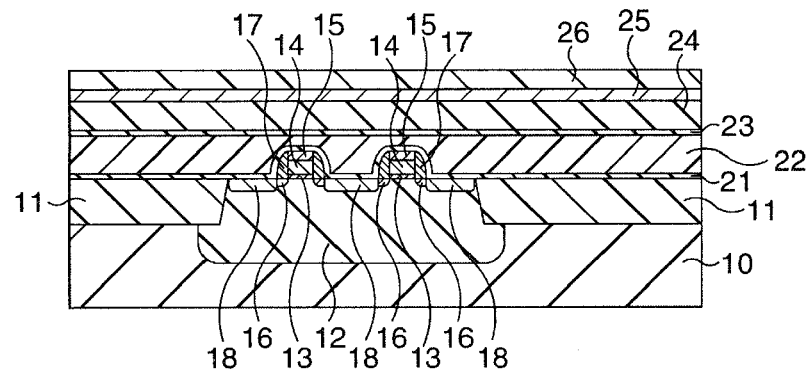
FIG. 1D is a schematic drawing showing a method of fabricating an FeRAM of a first embodiment.

Next, as shown in FIG. 1D, a lower electrode layer 24, a ferroelectric film 25 and an upper electrode layer 26 are sequentially formed.

More details, first a Ti film of approximately 20 nm thick and a Pt film of approximately 150 nm thick are sequentially deposited by sputtering, to thereby form the lower electrode layer 24 based on the stacked structure of the Ti film and the Pt film. Next, a ferroelectric film 25 of approximately 200 nm thick composed of a ferroelectric such as PZT is formed by RF sputtering on the lower electrode layer 24. The ferroelectric film 25 is then subjected to RTA, to thereby crystallize the ferroelectric film 25. Next, the upper electrode layer 26 of approximately 200 nm thick, typically composed of $IrO_2$ which is an electro-conductive oxide, is deposited by reactive sputtering on the ferroelectric film 25. In place of $IrO_2$, materials for composing the upper electrode layer 26 may be Ir, Ru, $RuO_2$, $SrRuO_3$, other electro-conductive oxides, and stacked structures composed of these materials.

Figure 2A:
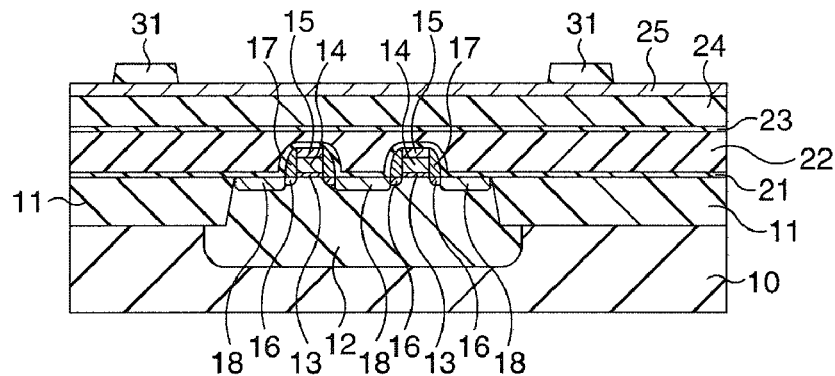
FIG. 2A is a schematic drawing showing a method of fabricating an FeRAM of a first embodiment.

Next, as shown in FIG. 2A, an upper electrode 31 is formed by patterning.

More details, an upper electrode layer 26 is then patterned by lithography and the succeeding dry etching into a geometry of a plurality of electrodes, to thereby form the upper electrode 31.

Figure 2B:
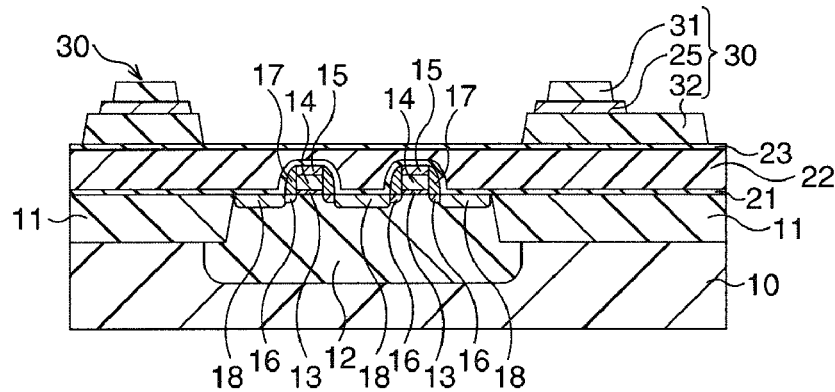
FIG. 2B is a schematic drawing showing a method of fabricating an FeRAM of a first embodiment.

Next, as shown in FIG. 2B, the ferroelectric film 25 and the lower electrode layer 24 are processed to form the ferroelectric capacitor structure 30.

More details, first the ferroelectric film 25 is processed by lithography and succeeding dry etching, as being aligned with the upper electrode 31, while adjusting the size thereof slightly larger than that of the upper electrode 31.

Next, the lower electrode layer 24 is processed by lithography and succeeding dry etching, as being aligned with thus-processed ferroelectric film 25, while adjusting the size thereof slightly larger than that of the ferroelectric film 25, to thereby form a lower electrode 32. By these processes, the ferroelectric capacitor structure 30 having the ferroelectric film 25 and the upper electrode 31 sequentially stacked on the on the lower electrode 32, wherein the lower electrode 32 and the upper electrode 31 are capacitively coupled while placing the ferroelectric film 25 in between, is completed.

Figure 2C:
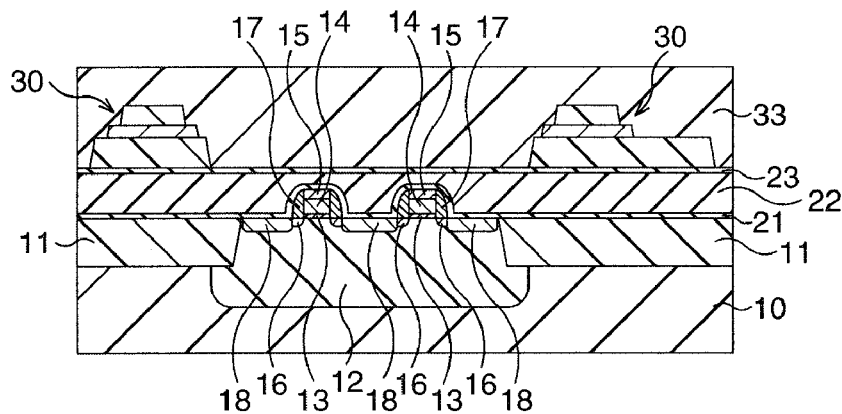
FIG. 2C is a schematic drawing showing a method of fabricating an FeRAM of a first embodiment.

Next, as shown in FIG. 2C, a second insulating interlayer 33 is formed.

More details, the second insulating interlayer 33 is formed so as to cover the ferroelectric capacitor structure 30. The second insulating interlayer 34 is formed by depositing, for example, a plasma TEOS film to as thick as approximately 1400 nm, and is then polished by CMP so as to reduce the thickness thereof to as small as approximately 1000 nm. After CMP, the second insulating interlayer 33 is annealed using, for example, $N_2O$ for the purpose of dewatering.

Figure 2D:
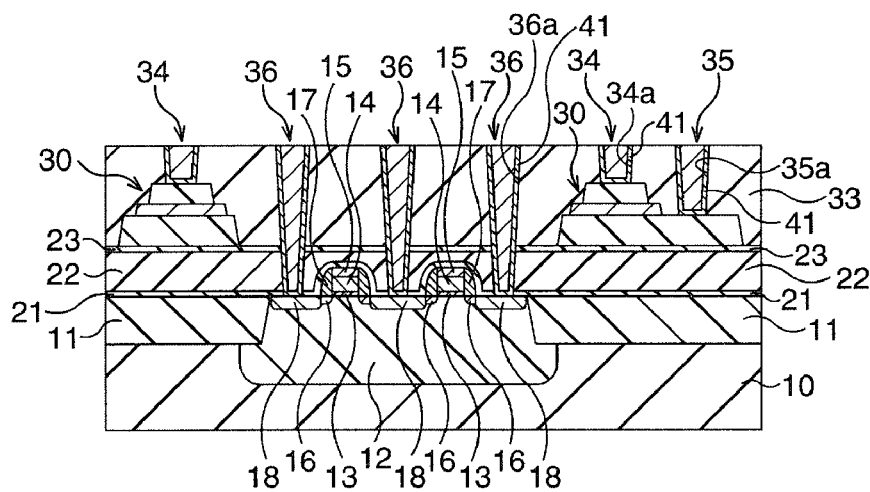
FIG. 2D is a schematic drawing showing a method of fabricating an FeRAM of a first embodiment.

Next, as shown in FIG. 2D, plugs 34, 35 of the ferroelectric capacitor structure 30, and a plug 36 connected to the source-and-drain region 18 of the transistor structure 10 are formed.

First, viaholes 34a, 35a directed to the ferroelectric capacitor structure 30 are formed.

More details, based on lithography and succeeding etching, a process of the second insulating interlayer 33 continued until a part of the surface of the upper electrode 31 is exposed, and a process of the second insulating interlayer 33 continued until a part of the surface of the lower electrode 32 are allowed to proceed in parallel, to thereby concomitantly form the viaholes 34a, 35a of, for example, approximately 0.5 µm in diameter at the individual portions. In the process of forming the viaholes 34a, 35a, the upper electrode 31 and the lower electrode 32 respectively serve as an etching stopper.

Next, the ferroelectric capacitor structure 30 is annealed so as to recover it from damages possibly given to the ferroelectric capacitor structure 30 in various processes after formation thereof. In this embodiment, annealing is allowed to proceed at a temperature of 500° C., in an oxygen atmosphere for 60 minutes.

Next, a viahole 36a directed to the source-and-drain region 18 of the transistor structure 10 is formed.

More details, the second insulating interlayer 33, the alignment improving film 23, the first insulating interlayer 22, and the protective film 21 are processed by lithography and succeeding dry etching until a part of the surface of the source-and-drain region 18 exposes, using the source-and-drain region 18 as an etching stopper, to thereby form the viahole 36a typically having a diameter of approximately 0.3 µm.

Next, plugs 34, 35, 36 are formed.

First, RF pretreatment corresponded to a depth of removal of several tens of nanometers on the basis of etching of general oxide film, which is a depth of removal of 10 nm or around herein, is carried out, and a TiN film, for example, of 75 nm thick is deposited by sputtering, so as to cover the individual wall surfaces of the viaholes 34a, 35a, 36a, to thereby form a underlying film (glue film) 41. A W film, for example, is then formed by CVD, so as to fill the viaholes 34a, 35a, 36a while placing the glue film 41 in between. The W film and the glue film 41 are then polished by CMP using the second insulating interlayer 33 as a stopper, to thereby form the plugs 34, 35, 36 having W as being filled in the viaholes 34a, 35a, 36a while placing the glue film 41 in between.

Figure 3A:
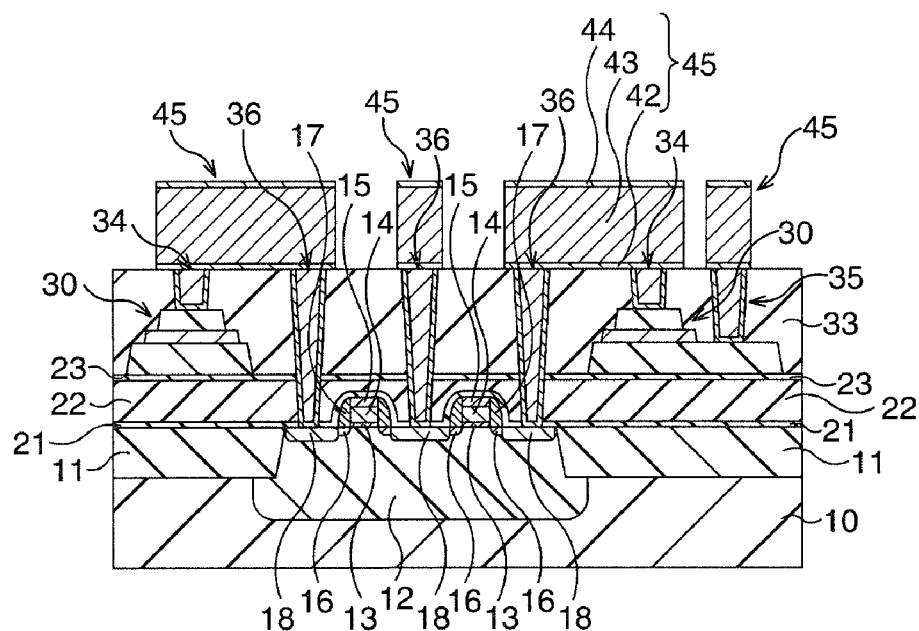
FIG. 3A is a schematic drawing showing a method of fabricating an FeRAM of a first embodiment.

Next, as shown in FIG. 3A, first interconnects 45 respectively connected to the plugs 34, 35, 36 are formed.

More details, first a barrier metal film 42, an interconnect film 43 and a barrier metal film 44 are deposited over the entire surface by sputtering. As the barrier metal film 42, a Ti film (approximately 60 nm thick) and a TiN film (approximately 30 nm thick), for example, are sequentially formed by sputtering. As the interconnect film 43, an Al alloy film (Al—Cu film herein) of approximately 360 nm thick is formed. As the barrier metal film 44, a Ti film (approximately 5 nm thick) and a TiN (approximately 70 nm thick), for example, are sequentially formed by sputtering. Because structure of the interconnect film 43 herein is designed similarly to that of the logic section other than FeRAM under the same design rule, no problem will arise in processing and reliability of the interconnects.

Next, a SiON film or an anti-reflection film (not shown) is formed as an anti-reflection film, and the anti-reflection film, the barrier metal film 44, the interconnect film 43 and the barrier metal film 42 are then processed by lithography and succeeding dry etching into a geometry of the interconnects, to thereby pattern the first interconnects 45. In place of forming the Al alloy film as the interconnect film 43, it is also allowable to form a Cu film (or Cu alloy film) making use of so-called damascene process, so as to form Cu interconnect as the first interconnect 45.

Figure 3B:
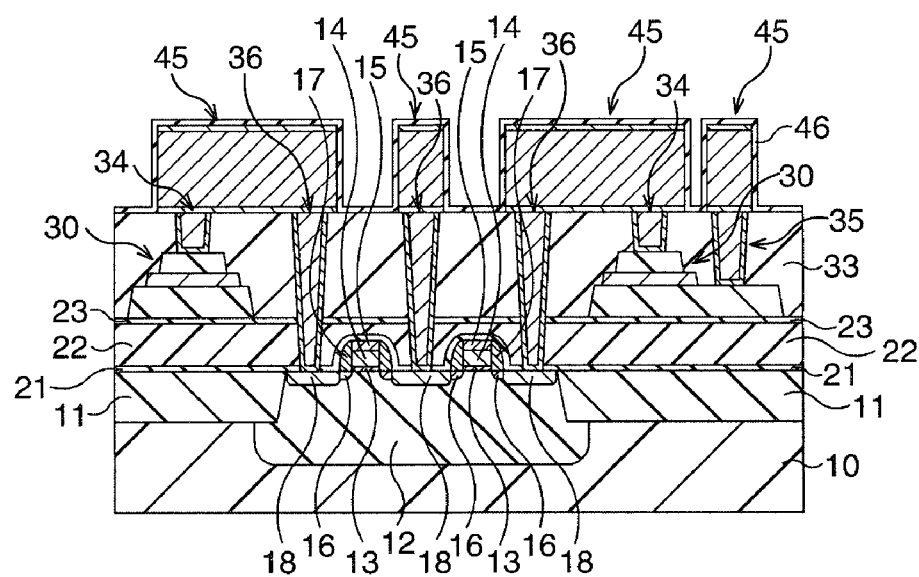
FIG. 3B is a schematic drawing showing a method of fabricating an FeRAM of a first embodiment.

Next, as shown in FIG. 3B, a protective film 46 for preventing degradation in characteristics of the ferroelectric capacitor structure 30 is formed.

More details, the protective film 46 is formed on the second insulating interlayer 33 so as to cover the first interconnect 45. The protective film 46 is aimed at suppressing damages possibly given to the ferroelectric capacitor structure 30 in the multi-layer forming processes after the ferroelectric capacitor structure 30 is formed, and is formed by sputtering to as thick as 20 nm or around, using a metal oxide film represented by alumina as a material.

Figure 4:
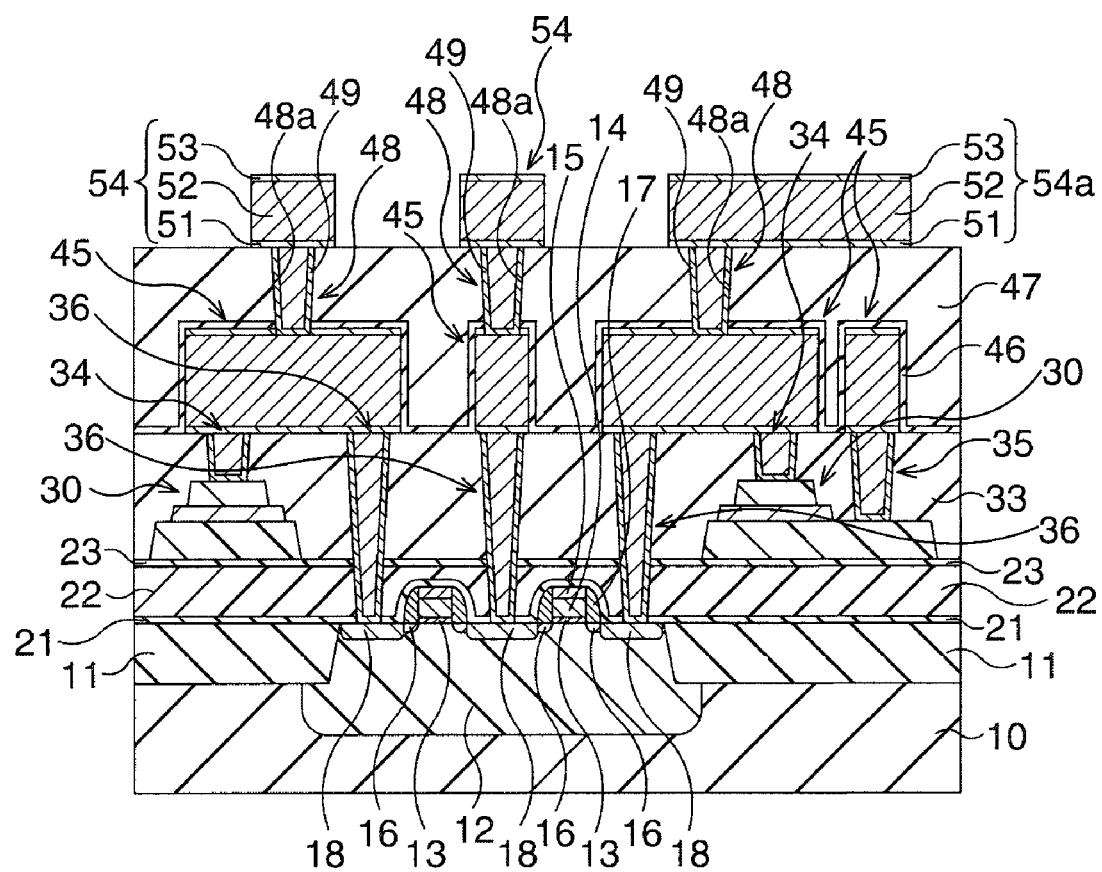
FIG. 4 is a schematic drawing showing a method of fabricating an FeRAM of a first embodiment.

Next, as shown in FIG. 4, second interconnects 54 connected to the first interconnects 45 are formed.

More details, first a third insulating interlayer 47 is formed so as to cover the interconnects 45 while placing a protective film 46 in between. As the third insulating interlayer 47, a silicon oxide film is formed to as thick as 700 nm or around, a plasma TEOS is formed so as to adjust the total thickness to 1100 nm or around, and the surface is polished by CMP to thereby reduce the thickness to 750 nm or around.

Next, plugs 48 connected to the interconnects 45 are formed.

The third insulating interlayer 47 and the protective film 46 are processed by lithography and succeeding etching until parts of the surface of the interconnects 45 expose, to thereby form viaholes 48a typically having a diameter of approximately 0.25 μm. Next, an underlying film (glue film) 49 is formed so as to cover the wall surfaces of the viaholes 48a, and a W film is formed by CVD so as to fill the viaholes 48a while placing the glue film 49 in between. The W film and the glue film 49 are typically polished using the third insulating interlayer 47 as a stopper, to thereby form the plugs 48 filling the viaholes 48a while placing the glue film 49 in between.

Next, second interconnect 54 respectively connected to the plugs 48 are formed.

First, a barrier metal film 51, an interconnect film 52 and a barrier metal film 53 are formed by sputtering over the entire surface. As the barrier metal film 51, a Ti film (approximately 60 nm thick) and a TiN film (approximately 30 nm thick), for example, are sequentially formed by sputtering. As the interconnect film 52, an Al alloy film (an Al—Cu film herein), for example, is formed to as thick as 360 nm or around. As the barrier metal film 53, a Ti film (approximately 5 nm thick) and a TiN (approximately 70 nm thick), for example, are sequentially formed by sputtering. Because structure of the interconnect film 52 herein is designed similarly to that of the logic section other than FeRAM under the same design rule, no problem will arise in processing and reliability of the interconnects.

Next, a SiON film or an anti-reflection film (not shown), for example, is formed as the anti-reflection film, and the anti-reflection film, the barrier metal film 53, the interconnect film 52 and the barrier metal film 51 are processed by lithography and succeeding dry etching into a geometry of the interconnects, to thereby pattern the second interconnects 54. In place of forming the Al alloy film as the interconnect film 52, it is also allowable to form a Cu film (or Cu alloy film) making use of so-called damascene process, so as to form Cu interconnect as the second interconnects 54.

Figure 5A:
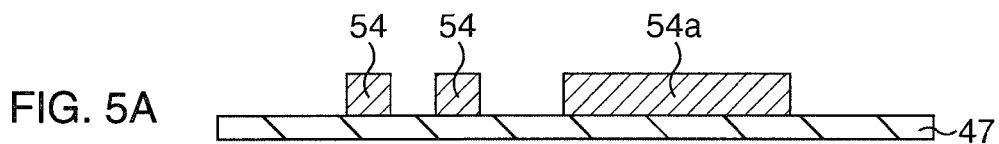
FIG. 5A is a schematic drawing showing a method of fabricating an FeRAM of a first embodiment.

A state in this stage is shown in FIG. 5A. FIG. 5A expresses the same state as FIG. 4, showing only the third insulating interlayer 47 and the portions thereabove of FIG. 4 (the barrier metal films 51, 53 and the plugs 48 are not shown). It is to be noted that, in FIG. 5A and individual drawings thereafter, the third insulating interlayer 47 and the portions thereunder will not be shown for the convenience of illustration. Of a plurality of second interconnects 24 in this embodiment, the rightmost second interconnect 54 is given as a pad electrode for establishing electrical connection (referred to as a pad electrode 54a, hereinafter).

Although the interconnect structure in this embodiment was exemplified by a double-layered structure composed of the first interconnect 45 and the second interconnect 54, it is also allowable to adopt a tree-layered structure or multi-layered structure having a larger number of layers.

Figure 5B:
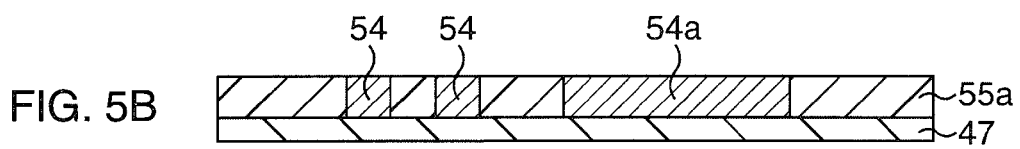
FIG. 5B is a schematic drawing showing a method of fabricating an FeRAM of a first embodiment.
Figure 5C:
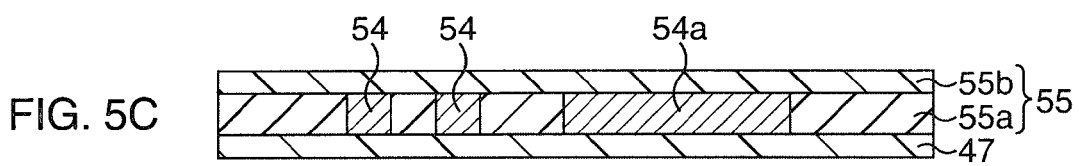
FIG. 5C is a schematic drawing showing a method of fabricating an FeRAM of a first embodiment.

Next, as shown in FIG. 5B and FIG. 5C, a fourth insulating interlayer 55 is formed so as to cover the second interconnect 54.

First, as shown in FIG. 5B, an insulating film 55a is formed so as to cover the second interconnect 54. As the insulating film 55a, a silicon oxide film is deposited typically by CVD using TEOS, to a thickness capable of burying the second interconnects 54. The surface of the insulating film 55a is then planarized by CMP, using the second interconnect 54 as a stopper.

Next, as shown in FIG. 5C, an insulating film 55b is formed on the insulating film 55a having thus-planarized surface. As the insulating film 55b, a silicon oxide film is formed typically by CVD using TEOS. With the insulating films 55a, 55b, the fourth insulating interlayer 55 of approximately 100 nm thick is formed so as to cover the second interconnect 54.

Figure 5D:
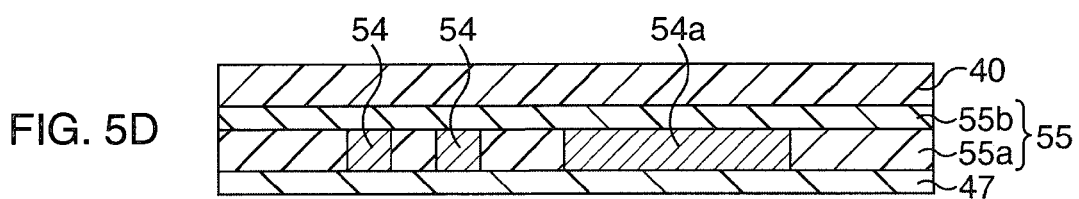
FIG. 5D is a schematic drawing showing a method of fabricating an FeRAM of a first embodiment.

Next, as shown in FIG. 5D, a thin film 40 which serves as a protective film blocking intrusion of water/hydrogen into the device is formed.

More details, as the thin film 40, a film composed of palladium (Pd) or palladium-containing material, or iridium (Ir) or iridium oxide (IrO$_x$: typically x=2) or material containing these materials (simply referred to as "materials of the embodiment", hereinafter) is formed typically by sputtering, to a thickness of 20 nm or around. In this process, the thin film 40 is formed over the entire surface of the silicon semiconductor substrate 10, that is, not only over the memory region, but also over the entire portion above the silicon semiconductor substrate 10 containing the peripheral circuit region and the scribing region.

Figure 5E:
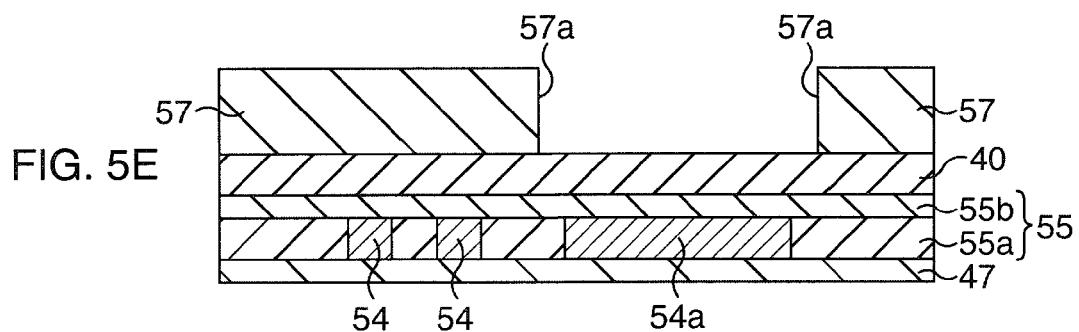
FIG. 5E is a schematic drawing showing a method of fabricating an FeRAM of a first embodiment.

Next, as shown in FIG. 5E, a resist pattern 57 used for processing the thin film 40 is formed.

More details, a resist is coated over the entire surface of the thin film 40, the resist is processed by lithography, to thereby form a resist pattern 57 having an opening 57a allowing a site of the thin film 40 aligned above the pad electrode 54a to expose therein. The opening 57a herein is preferably formed as being slightly larger than the pad electrode 54a.

Figure 5F:
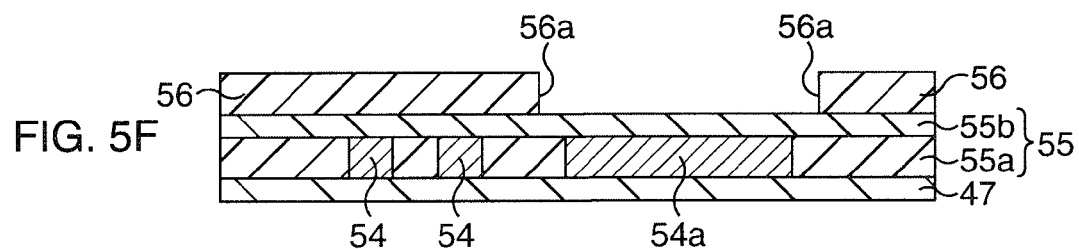
FIG. 5F is a schematic drawing showing a method of fabricating an FeRAM of a first embodiment.

Next, as shown in FIG. 5F, the thin film 40 is processed.

Figure 7:
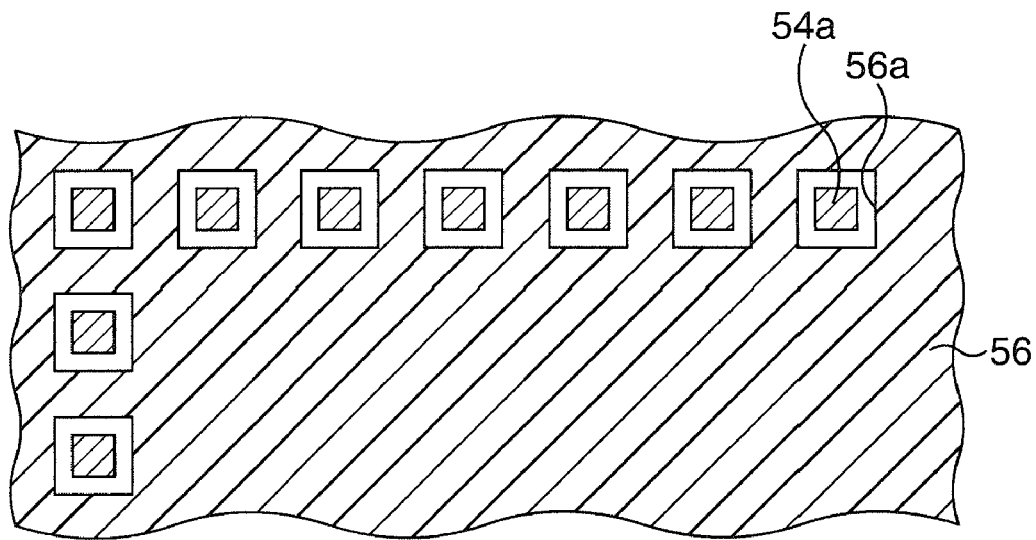
FIG. 7 is a schematic plan view showing a plan view of a protective film.

More details, the thin film 40 is dry etched through the resist pattern 57 as a mask. By this process, an opening 56a is formed in the thin film 40, so as to allow a part of the surface of the fourth insulating interlayer 55 to expose therein, conforming to the opening 57a of the resist pattern 57, and thereby the protective film 56 is completed. A plan view of the protective film 56 is shown in FIG. 7. As seen in the drawing, the protective film 56 is formed so as to cover the entire range above the silicon semiconductor substrate 10 excluding sites of formation of the pad electrodes 54a, and so as to cover the periphery of the pad electrodes 54a, while being electrically isolated from the pad electrode 54a. The resist pattern 57 is then removed typically by ashing.

Figure 6A:
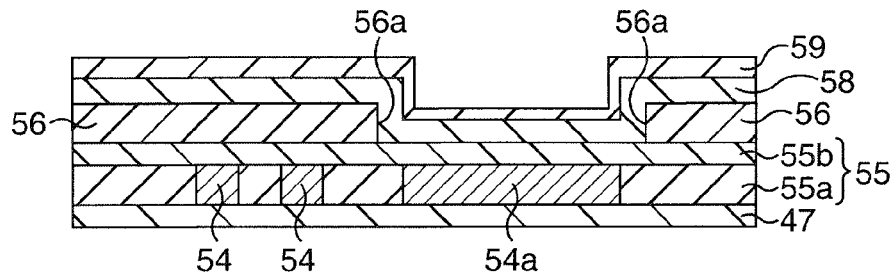
FIG. 6A is a schematic drawing showing a method of fabricating an FeRAM of a first embodiment.

Next, as shown in FIG. 6A, an insulating film 58 and an upper protective film 59 are formed.

More details, a silicon oxide film, for example, is deposited to as thick as 100 nm or around on the protective film 56 including the inside of the opening 56a, and the upper protective film, exemplified as a silicon nitride film herein, is deposited on the insulating film 58 to as thick as approximately 350 nm.

Figure 6B:
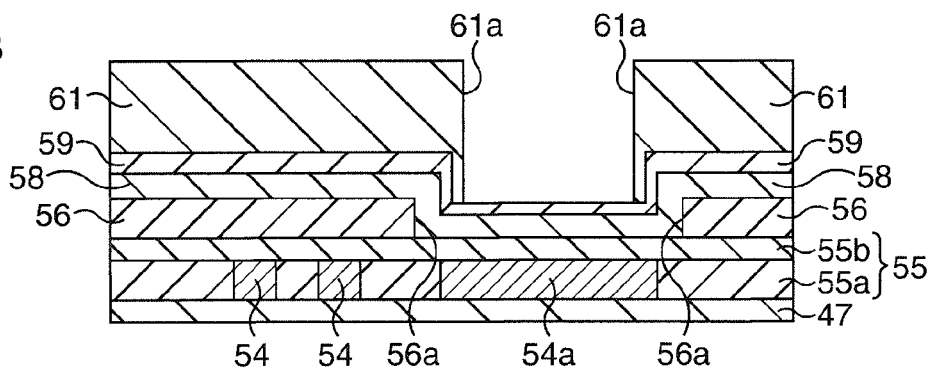
FIG. 6B is a schematic drawing showing a method of fabricating an FeRAM of a first embodiment.

Next, as shown in FIG. 6B, a resist pattern 61 allowing a part of the surface of the pad electrode 54a to expose therein is formed.

More details, a resist is coated over the entire surface of the upper protective film 59, the resist is then processed by lithography, to thereby form the resist pattern 61 having an opening 61a allowing a site aligned above the pad electrode 54a to expose therein. For the purpose of preventing the side faces of the upper protective film 59 from being etched, at the site of the upper protective film 59 aligned with the opening 56a, it is preferable to form the opening 61a slightly smaller than the site.

Figure 6C:
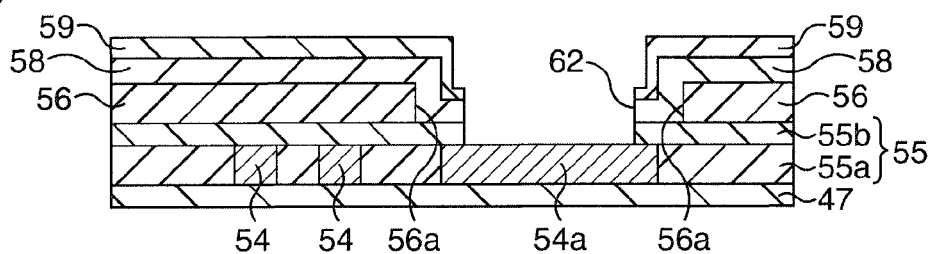
FIG. 6C is a schematic drawing showing a method of fabricating an FeRAM of a first embodiment.

Next, as shown in FIG. 6C, the upper protective film 59, the insulating film 58 and the fourth insulating interlayer 55 are processed.

More details, the upper protective film 59, the insulating film 58 and the fourth insulating interlayer 55 are dry etched through the resist pattern 61 used as a mask. By this process, an opening 62 is formed in the upper protective film 59, the insulating film 58 and the fourth insulating interlayer 55, so as to allow a part of the surface of the pad electrode 54a to expose therein, conforming to the opening 61a of the resist pattern 61. The resist pattern 61 is then removed by ashing.

Figure 6D:
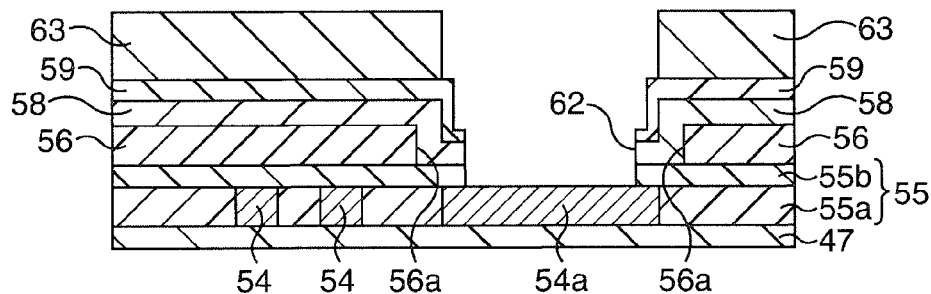
FIG. 6D is a schematic drawing showing a method of fabricating an FeRAM of a first embodiment.

Next, as shown in FIG. 6D, a polyimide film 63 is formed so as to surround the opening 62.

More details, the polyimide film 63 is deposited to as thick as approximately 3 μm (3000 nm), and an opening 63a slightly larger than the opening 62 is formed as being aligned with the opening 62. By these processes, the FeRAM is completed.

In this embodiment, the protective film 56 is formed using palladium (Pd) or a palladium-containing material so as to cover the periphery of the pad electrode 54a, while being isolated from the pad electrode 54a, and the protective film 56 consequently covers almost all regions possibly serve as the path of intrusion of water/hydrogen, so that hydrogen generated by the catalytic action may reliably be absorbed by the protective film 56, intrusion of water/hydrogen into the underlying second to fourth insulating interlayers 33, 47, 55 or the like may be blocked, and thereby high performance of the ferroelectric capacitor 30 may be maintained.

On the other hand, in this embodiment, the protective film 56 is formed using the materials of the embodiment so as to cover the periphery of the pad electrode 54a, while being isolated from the pad electrode 54a, and the protective film 56 consequently covers almost all regions possibly serve as the path of intrusion of water/hydrogen, so that hydrogen generated by the catalytic action may reliably be absorbed by the protective film 56, water/hydrogen is blocked by the protective film 56, intrusion of water/hydrogen into the underlying second to fourth insulating interlayers 33, 47, 55 or the like may be blocked, and thereby high performance of the ferroelectric capacitor 30 may be maintained.

In this embodiment, intrusion of water/hydrogen may further reliably be suppressed, by forming the protective film 46 composed of alumina, together with the protective film 56.

Because the protective film 56 in this embodiment is not necessarily electro-conductive, it is good enough for the protective film to have a thickness only sufficient for blocking water/hydrogen, typically as thin as 20 nm or around. The protective film 56 having a certain level of thickness may make precise etching difficult, due to palladium (Pd) or iridium (Ir) contained therein as a noble metal, whereas the film being only as thick as 20 nm or around may be patterned by dry etching in a simple and accurate manner, without using a hard mask or the like.

As has been explained in the above, this embodiment successfully realizes an FeRAM capable of reliably preventing water/hydrogen from entering inside only by a simple configuration, and of maintaining high performance of the ferroelectric capacitor structure 30.

MODIFIED EXAMPLE

Paragraphs below will explain Modified Examples of the first embodiment. In these Modified Examples, any constituents similar to those disclosed in the first embodiment will be given with the same reference numerals, and explanations in detail will not be repeated.

Modified Example 1

In addition to the configuration of FeRAM disclosed in the first embodiment, this Modified Example has a protective film for preventing degradation in characteristics of the ferroelectric capacitor structure 30 formed so as to surround the pad electrode 54a.

FIG. 8 shows schematic sectional views expressing principal process steps in the method of fabricating an FeRAM according to Modified Example 1.

First, similarly to as in the first embodiment, the MOS transistor 20, the ferroelectric capacitor structure 30, the first interconnects 45, the second interconnects 54 and so forth are formed according to the process steps shown in FIG. 1A to FIG. 1D, FIG. 2A to FIG. 2D, FIG. 3A, FIG. 3B and FIG. 4 (FIG. 5A).

Figure 8A:
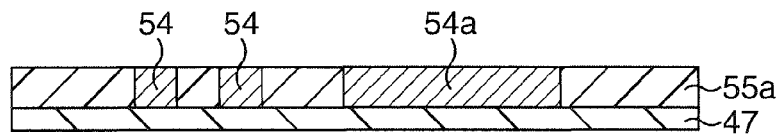
FIG. 8A is a schematic sectional view showing a method of fabricating an FeRAM according to Modified Example 1 of the first embodiment.

Next, similarly to as shown in FIG. 5B, and as shown in FIG. 8A, the insulating film 55a is formed so as to cover the second interconnects 54. As the insulating film 55a, a silicon oxide film is deposited typically by CVD using TEOS, to a thickness capable of burying the second interconnects 54. The surface of the insulating film 55a is then planarized by CMP, using the second interconnect 54 as a stopper.

Figure 8B:
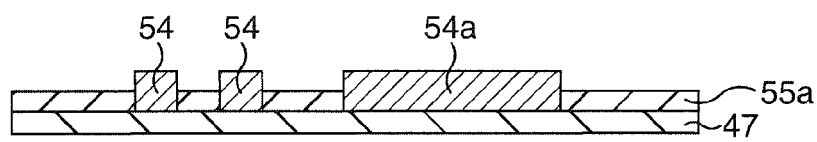
FIG. 8B is a schematic sectional view showing a method of fabricating an FeRAM according to Modified Example 1 of the first embodiment.

Next, as shown in FIG. 8B, the surficial portion of the insulating film 55a is selectively removed, to thereby allow the upper portion of the second interconnect 54 to expose. The surficial portion of the insulating film 55a herein is selectively removed typically by anisotropic etching over the entire surface, so-called etchback.

Figure 8C:
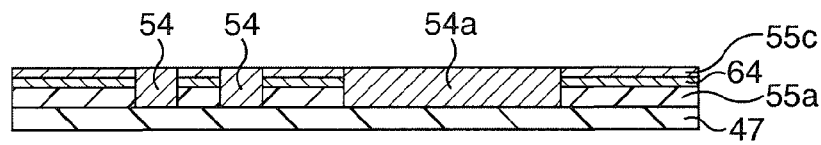
FIG. 8C is a schematic sectional view showing a method of fabricating an FeRAM according to Modified Example 1 of the first embodiment.

Next, as shown in FIG. 8C, a protective film 64 for preventing degradation of characteristics of the ferroelectric capacitor structure 30 and an insulating film 55c are stacked so as to surround the pad electrode 54a. The protective film 64 is formed typically by sputtering, using a metal oxide film, exemplified by alumina, as a material to as thick as 20 nm or around. As the insulating film 55c, a silicon oxide film is formed typically by CVD using TEOS. More details, alumina aimed at composing the protective film 64 is deposited, a silicon oxide film aimed at composing the insulating film 55c is deposited, and the surface of the insulating film 55c is planarized by CMP, using the second interconnect 54 as a stopper.

Figure 8D:
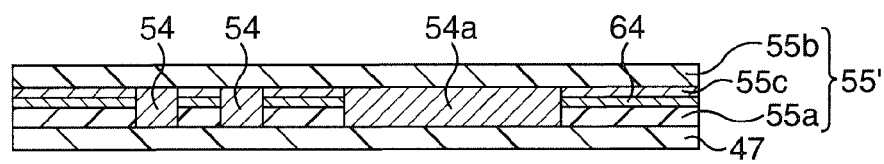
FIG. 8D is a schematic sectional view showing a method of fabricating an FeRAM according to Modified Example 1 of the first embodiment.

Next, as shown in FIG. 8D, the insulating film 55b is formed on the planarized surface of the insulating film 55c. As the insulating film 55b, a silicon oxide film is formed typically by CVD using TEOS. By the insulating films 55a, 55c, 55b, a fourth insulating interlayer 55' is configured as having the protective film 64 which surrounds the pad electrode 54a by the side faces thereof incorporated therein, and as having the pad electrode 54a and the second interconnect 54 buried therein.

Figure 8E:
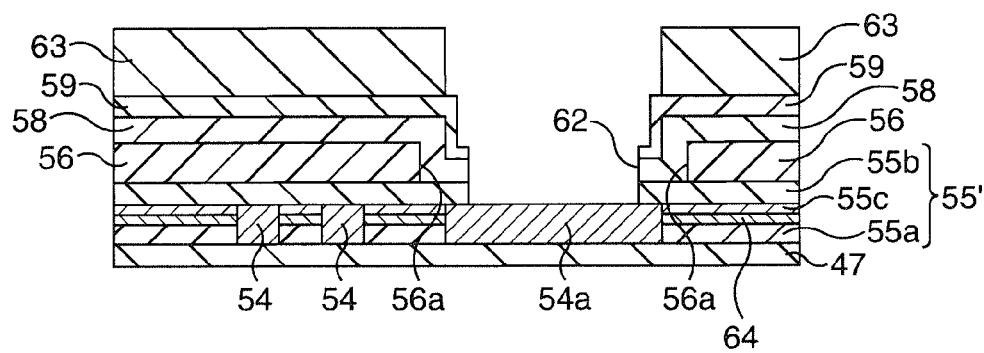
FIG. 8E is a schematic sectional view showing a method of fabricating an FeRAM according to Modified Example 1 of the first embodiment.

Then similarly to as shown in FIG. 5D, the protective film 56 for blocking intrusion of water/hydrogen into the inside of the device is formed, and the FeRAM shown in FIG. 8E is completed after going through the individual process steps shown in FIG. 5E, FIG. 5F, FIG. 6A to FIG. 6D.

In Modified Example 1, the protective film 56 is formed using palladium (Pd) or a palladium-containing material so as to cover the periphery of the pad electrode 54a, while being isolated from the pad electrode 54a, and the protective film 56 consequently covers almost all regions possibly serve as the path of intrusion of water/hydrogen, so that hydrogen generated by the catalytic action may reliably be absorbed by the protective film 56, intrusion of water/hydrogen into the underlying second to fourth insulating interlayers 33, 47, 55 or the like may be blocked, and thereby high performance of the ferroelectric capacitor 30 may be maintained.

On the other hand, in Modified Example 1, the protective film 56 is formed using iridium (Ir) or iridium oxide, or an iridium (Ir)- or iridium-oxide-containing material so as to cover the periphery of the pad electrode 54a, while being isolated from the pad electrode 54a, and the protective film 56 consequently covers almost all regions possibly serve as the path of intrusion of water/hydrogen, so that hydrogen generated by the catalytic action may reliably be absorbed by the protective film 56, intrusion of water/hydrogen into the underlying second to fourth insulating interlayers 33, 47, 55' or the like may be blocked, and thereby high performance of the ferroelectric capacitor 30 may be maintained.

In Modified Example 1, intrusion of water/hydrogen may further reliably be suppressed, by forming the protective film 64 composed of alumina so as to surround the side faces of the pad electrode 54a, in addition to the protective film 46 composed of alumina, together with the protective film 56.

Because the protective film 56 in Modified Example 1 is not necessarily electro-conductive, it is good enough for the protective film to have a thickness only sufficient for blocking water/hydrogen, typically as thin as 20 nm or around. The protective film 56 having a certain level of thickness may make precise etching difficult, due to palladium (Pd) or iridium (Ir) contained therein as a noble metal, whereas the film being only as thick as 20 nm or around may be patterned by dry etching in a simple and accurate manner, without using a hard mask or the like.

As has been explained in the above, Modified Example 1 successfully realizes an FeRAM capable of reliably preventing water/hydrogen from entering inside only by a simple configuration, and of maintaining high performance of the ferroelectric capacitor structure 30.

Modified Example 2

In this Example, in addition to the configuration of FeRAM disclosed in the first embodiment, a protective film for preventing degradation of characteristics of the ferroelectric capacitor structure 30 is formed also on the pad electrode 54a.

FIG. 9 shows schematic sectional views expressing principal process steps in the method of fabricating an FeRAM according to Modified Example 2.

First, similarly to as in the first embodiment, the MOS transistor 20, the ferroelectric capacitor structure 30, the first interconnects 45, the second interconnects 54 and so forth are formed according to the process steps shown in FIG. 1A to FIG. 1D, FIG. 2A to FIG. 2D, FIG. 3A, FIG. 3B and FIG. 4 (FIG. 5A).

Figure 9A:
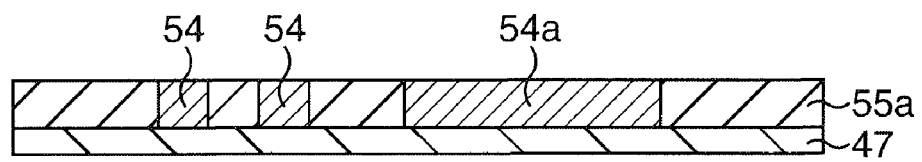
FIG. 9A is a schematic sectional view showing a method of fabricating an FeRAM according to Modified Example 2 of the first embodiment.

Next, similarly to as shown in FIG. 5B, and as shown in FIG. 9A, the insulating film 55a is formed so as to cover the second interconnects 54. As the insulating film 55a, a silicon oxide film is deposited typically by CVD using TEOS, to a thickness capable of burying the second interconnects 54. The surface of the insulating film 55a is then planarized by CMP, using the second interconnect 54 as a stopper.

Figure 9B:
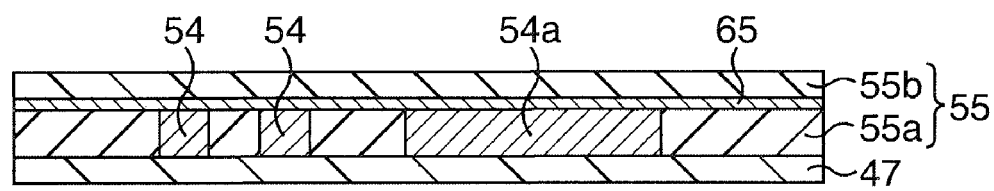
FIG. 9B is a schematic sectional view showing a method of fabricating an FeRAM according to Modified Example 2 of the first embodiment.

Next, as shown in FIG. 9B, a protective film 65 for preventing degradation in characteristics of the ferroelectric capacitor structure 30 and the insulating film 55b are formed in a stacked manner on the planarized surface of the insulating film 55a. The protective film 65 is formed typically by sputtering, using a metal oxide film, exemplified by alumina, as a material to as thick as 20 nm or around. As the insulating film 55b, a silicon oxide film is formed typically by CVD using TEOS. By the insulating films 55a, 55b, a fourth insulating interlayer 55 is configured as having the protective film 65 which covers the surface of the pad electrode 54a and the second interconnects 54 incorporated therein, and as having the pad electrode 54a and the second interconnect 54 buried therein.

Figure 9C:
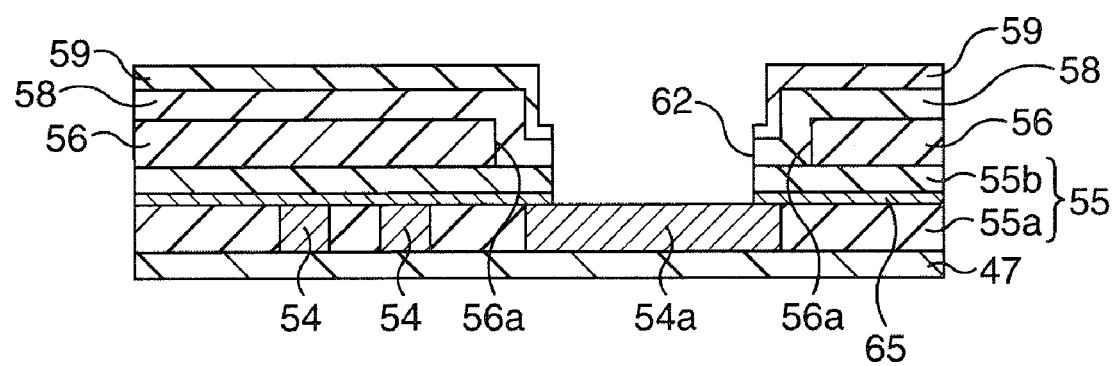
FIG. 9C is a schematic sectional view showing a method of fabricating an FeRAM according to Modified Example 2 of the first embodiment.

Then similarly to as shown in FIG. 5D, the protective film 56 for blocking intrusion of water/hydrogen into the inside of the device is formed, and the FeRAM shown in FIG. 9C is completed after going through the individual process steps shown in FIG. 5E, FIG. 5F, FIG. 6A to FIG. 6D.

In Modified Example 2, the protective film 56 is formed using palladium (Pd) or a palladium-containing material so as to cover the periphery of the pad electrode 54a, while being isolated from the pad electrode 54a, and the protective film 56 consequently covers almost all regions possibly serve as the path of intrusion of water/hydrogen, so that hydrogen generated by the catalytic action may reliably be absorbed by the protective film 56, intrusion of water/hydrogen into the underlying second to fourth insulating interlayers 33, 47, 55 or the like may be blocked, and thereby high performance of the ferroelectric capacitor 30 may be maintained.

On the other hand, in Modified Example 2, the protective film 56 is formed using iridium (Ir) or iridium oxide, or an iridium (Ir)- or iridium-oxide-containing material so as to cover the periphery of the pad electrode 54a, while being isolated from the pad electrode 54a, and the protective film 56 consequently covers almost all regions possibly serve as the path of intrusion of water/hydrogen, so that hydrogen generated by the catalytic action may reliably be absorbed by the protective film 56, intrusion of water/hydrogen into the underlying second to fourth insulating interlayers 33, 47, 55 or the like may be blocked, and thereby high performance of the ferroelectric capacitor 30 may be maintained.

In Modified Example 2, intrusion of water/hydrogen may further reliably be suppressed, by forming the protective film 65 composed of alumina so as to cover the pad electrode 54a, in addition to the protective film 46 composed of alumina, together with the protective film 56.

Because the protective film 56 in Modified Example 2 is not necessarily electro-conductive, it is good enough for the protective film to have a thickness only sufficient for blocking water/hydrogen, typically as thin as 20 nm or around. The protective film 56 having a certain level of thickness may make precise etching difficult, due to palladium (Pd) or iridium (Ir) contained therein as a noble metal, whereas the film being only as thick as 20 nm or around may be patterned by dry etching in a simple and accurate manner, without using a hard mask or the like.

As has been explained in the above, Modified Example 2 successfully realizes an FeRAM capable of reliably preventing water/hydrogen from entering inside only by a simple configuration, and of maintaining high performance of the ferroelectric capacitor structure 30.

Second Embodiment

In this embodiment, in addition to the configuration of FeRAM disclosed in the first embodiment, the pad electrode is formed using the same material with the protective film 56.

FIG. 10 and FIG. 11 are schematic sectional views sequentially showing configurations of the FeRAM of this embodiment, according to a method of manufacturing the same.

First, similarly to as in the first embodiment, the MOS transistor 20, the ferroelectric capacitor structure 30, the first interconnects 45, the second interconnects 54 and so forth are formed according to the process steps shown in FIG. 1A to FIG. 1D, FIG. 2A to FIG. 2D, FIG. 3A, FIG. 3B and FIG. 4 (FIG. 5A). In this embodiment, unlike the first embodiment, a pad electrode is formed on the upper portion of the rightmost second interconnect 54 in the drawing. The rightmost second interconnect in the drawing will now be referred to as second interconnect 54b for the convenience's sake.

Next, as shown in FIG. 10A, the fourth insulating interlayer 55 is formed so as to cover the second interconnect 54.

First, the insulating film 55a is formed so as to cover the second interconnect 54. As the insulating film 55a, a silicon oxide film is deposited typically by CVD using TEOS, to a thickness capable of burying the second interconnects 54. The surface of the insulating film 55a is then planarized by CMP, using the second interconnect 54 as a stopper.

Next, the insulating film 55b is formed on the planarized surface of the insulating film 55a. As the insulating film 55b, a silicon oxide film is deposited typically by CVD using TEOS. By the insulating films 55a, 55b, a fourth insulating interlayer 55 of approximately 100 nm thick is configured so as to cover the second interconnect 54.

Next, as shown in FIG. 10B, a resist pattern 66 through which viaholes are formed in the fourth insulating interlayer is formed.

More details, a resist is coated over the entire surface of the fourth insulating interlayer 55, the resist is then processed by lithography, to thereby form the resist pattern 66 having openings 66a allowing sites aligned above the second interconnect 54b to expose therein.

Next, as shown in FIG. 10C, the fourth insulating interlayer 55 is processed.

More details, the fourth insulating interlayer 55 (insulating film 55b) is dry etched through the resist pattern 66 used as a mask. By this process, viaholes 67 are formed in the fourth insulating interlayer 55 (insulating film 55b), so as to allow parts of the surface of the second interconnect 54b to expose therein, conforming to the openings 66a of the resist pattern 66. The resist pattern 66 is then removed by ashing.

Next, as shown in FIG. 10D, plugs 68 connected to the second interconnect 54b are formed.

More details, a W film, for example, is formed so as to fill up the viaholes 67. The W film is then polished by CMP using the fourth insulating interlayer 55 (insulating film 55b) as the stopper, to thereby form the plugs 68 having W as being filled in the viaholes 67.

Next, as shown in FIG. 10E, a thin film 40 aimed at composing a protective film for blocking intrusion of water/hydrogen into the inside of the device and the pad electrodes, is formed.

More details, as the thin film 40, an electro-conductive film containing the materials of the embodiment is formed typically by sputtering to a thickness of approximately 600 nm. The thin film 40 herein is formed over the entire surface of the silicon semiconductor substrate 10, that is, over the entire portion up above the silicon semiconductor substrate 10, including not only the memory cell region, but also the peripheral circuit region and the scribing region.

Next, as shown in FIG. 10F, a resist pattern 69 through which the thin film 40 is processed is formed.

More details, a resist is coated over the entire surface of the thin film 40, and the resist is then processed by lithography to thereby form the resist pattern 69 having a trench 69a allowing a part of the surface of the thin film 40 to expose therein, so as to leave the resist just as an island at a site aligned above the second interconnect 54b.

Next, as shown in FIG. 10G, the thin film 40 is processed.

Figure 12:
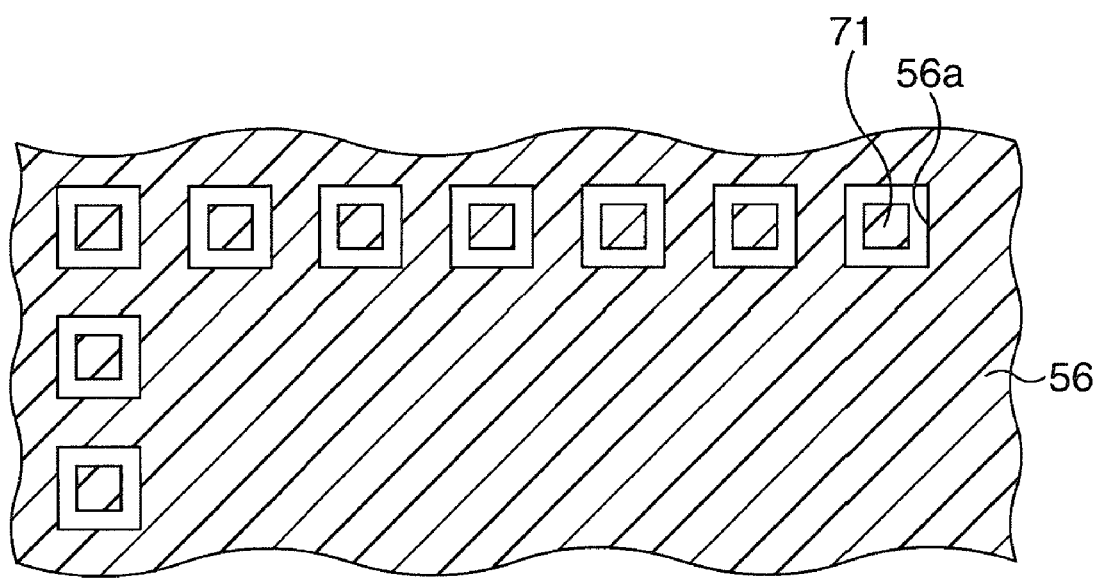
FIG. 12 is a schematic plan view showing a plan view of a protective film.

More details, the thin film 40 is dry etched through the resist pattern 69 used as a mask. By this process, a trench 40a is formed in the thin film 40, so as to allow a part of the surface of the fourth insulating interlayer 55 to expose therein, conforming to the trench 69a of the resist pattern 69, wherein the thin film 40 is disconnected by the trench 40a. In this way, the protective film 56 for blocking intrusion of water/hydrogen into the inside of the device, and the pad electrode 71 connected through the plugs 68 to the second interconnect 54b so as to establish electrical connection with the external, may be formed at the same time. A plan view of the protective film 56 and the pad electrode 71 is shown in FIG. 12. As seen in the drawing, the protective film 56 is formed so as to cover the entire portion above the silicon semiconductor substrate 10 excluding sites of formation of the pad electrodes 71, so as to cover the periphery of the pad electrodes 71, while being electrically isolated from the pad electrodes 71. Thereafter, the resist pattern 69 is removed by ashing.

Figure 11A:
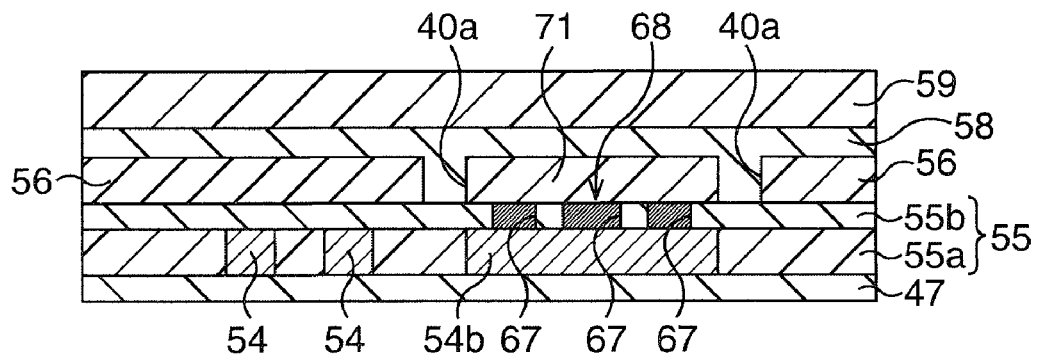
FIG. 11A is a schematic drawing showing a method of fabricating an FeRAM of a second embodiment.

Next, as shown in FIG. 11A, the insulating film 58 and the upper protective film 59 are formed.

More details, the insulating film 58, exemplified by a silicon oxide film, is formed to a thickness of approximately 1500 nm on the protective film 56 including the inside of the trench 40a and on the pad electrode 71, the surface of the silicon oxide film is then planarized by CMP, and an upper protective film 72, exemplified by a silicon nitride film, is formed on the insulating film 58 to as thick as 350 nm or around.

Figure 11B:
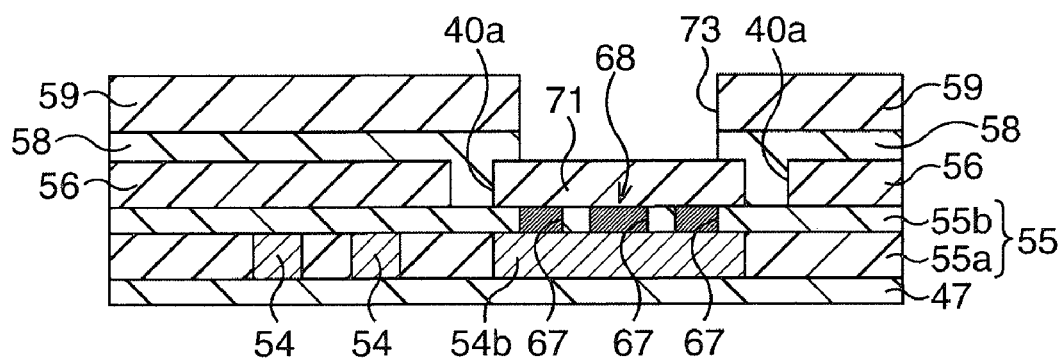
FIG. 11B is a schematic drawing showing a method of fabricating an FeRAM of a second embodiment.

Next, as shown in FIG. 11B, an opening 73 allowing a part of the surface of the pad electrode 71 to expose therein, is formed.

More details, the upper protective film 72 and the insulating film 58 are processed by lithography and succeeding dry etching, to thereby form the opening 73 in the upper protective film 72 and the insulating film 58, so as to allow a part of the surface of the pad electrode 71 to expose therein.

Figure 11C:
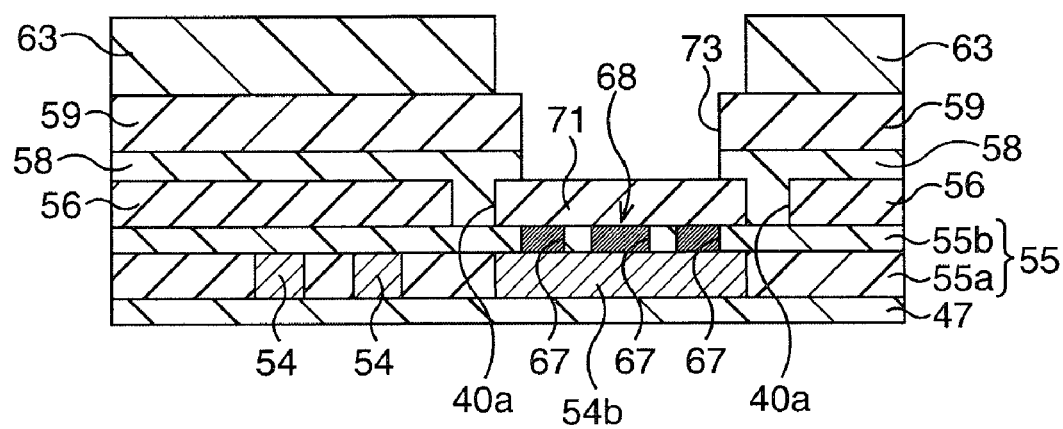
FIG. 11C is a schematic drawing showing a method of fabricating an FeRAM of a second embodiment.

Next, as shown in FIG. 11C, the polyimide film 63 is formed so as to cover the periphery of the opening 62.

More details, the polyimide film 63 of approximately 3 µm thick is deposited, and therein the opening 63a slightly larger than the opening 73 is formed as being aligned with the opening 73. By these processes, the FeRAM is completed.

For the case where the protective film 56 and the pad electrode 71 are formed using palladium (Pd) or a palladium-containing material in this embodiment, the pad electrode 71 not only functions as a site of electrical connection, but also functions as blocking intrusion of water/hydrogen, in cooperation with the protective film 56. In other words, the protective film 56 and the pad electrode 71 consequently cover almost all regions possibly serve as the path of intrusion of water/hydrogen, so that hydrogen generated by the catalytic action may reliably be absorbed by the protective film 56 and the pad electrode 71, intrusion of water/hydrogen into the underlying second to fourth insulating interlayers 33, 47, 55 or the like may be blocked, and thereby high performance of the ferroelectric capacitor 30 may be maintained.

On the other hand, for the case where the protective film 56 and the pad electrode 71 are formed using iridium (Ir) or iridium oxide, or iridium (Ir)- or iridium-oxide-containing electro-conductive material in this embodiment, the pad electrode 71 not only functions as a site of electrical connection, but also functions as blocking intrusion of water/hydrogen, in cooperation with the protective film 56. In other words, the protective film 56 and the pad electrode 71 consequently cover almost all regions possibly serve as the path of intrusion of water/hydrogen, so that hydrogen generated by the catalytic action may reliably be absorbed by the protective film 56 and the pad electrode 71, intrusion of water/hydrogen into the underlying second to fourth insulating interlayers 33, 47, 55 or the like may be blocked, and thereby high performance of the ferroelectric capacitor 30 may be maintained.

In this embodiment, intrusion of water/hydrogen may further reliably be suppressed, by forming the protective film 46 composed of alumina, together with the protective film 56 and the pad electrode 71.

As has been explained in the above, this embodiment successfully realizes an FeRAM capable of reliably preventing water/hydrogen from entering inside only by a simple configuration, and of maintaining high performance of the ferroelectric capacitor structure 30.

For an exemplary case where the thin film 40 is formed to as thick as 20 nm or above, typically to 70 nm or around in the process step shown in FIG. 10E, for the convenience of inspection of the pad electrode 71, patterning of the pad electrode 71, based on the general dry etching, would be more difficult considering that the pad electrode 71 is composed of a material containing a noble metal. It would, therefore, be necessary to carry out the patterning in this case by using a so-called hard mask, in place of using a resist pattern. Paragraphs below will explain the patterning using the hard mask.

FIG. 13 and FIG. 14 are schematic sectional views showing process steps of patterning of the pad electrode and the protective film using the hard mask, as alternatives of those shown in FIG. 10F and FIG. 11A.

Figure 13A:
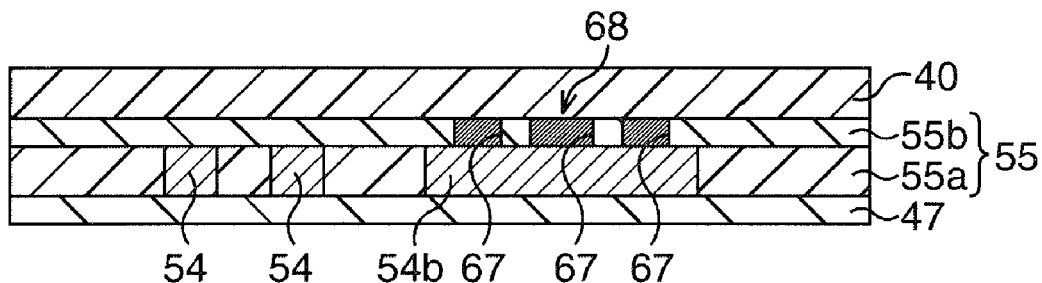
FIG. 13A is a schematic sectional view showing a process step of patterning a pad electrode and a protective film through a hard mask, as an alternative to FIG. 10F and FIG. 11A.

First, similarly to as shown in FIG. 10E, the thin film 40 is formed as shown in FIG. 13A.

Figure 13B:
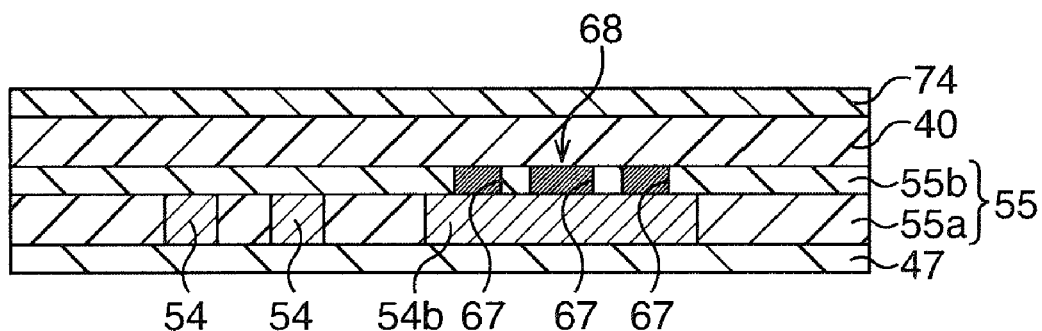
FIG. 13B is a schematic sectional view showing a process step of patterning a pad electrode and a protective film through a hard mask, as an alternative to FIG. 10F and FIG. 11A.

Next, as shown in FIG. 13B, a lower film 74 is formed on the thin film 40. The lower film 74 is formed typically by depositing a TiN film of approximately 200 nm thick by sputtering. It is also allowable to form Ti—Al—N, for example, in place of TiN.

Figure 13C:
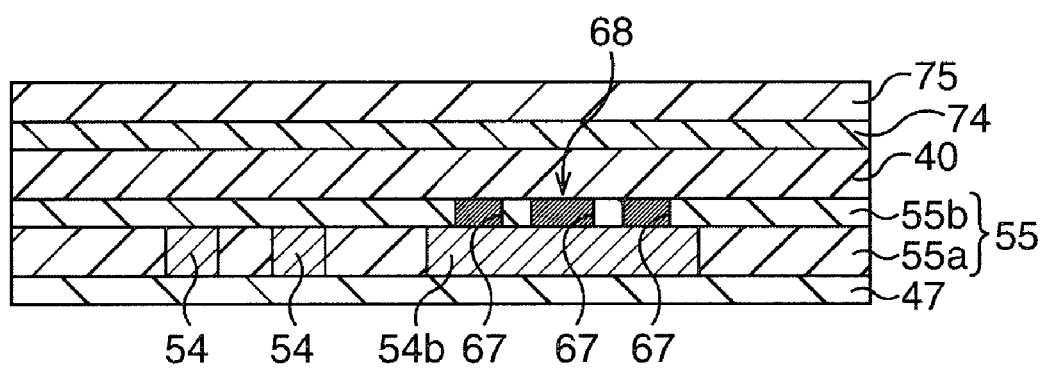
FIG. 13C is a schematic sectional view showing a process step of patterning a pad electrode and a protective film through a hard mask, as an alternative to FIG. 10F and FIG. 11A.

Next, as shown in FIG. 13C, an upper film 75 is formed on the lower film 74. The upper film 75 is formed by depositing a silicon oxide film of approximately 800 nm thick, typically by CVD using TEOS.

Figure 14A:
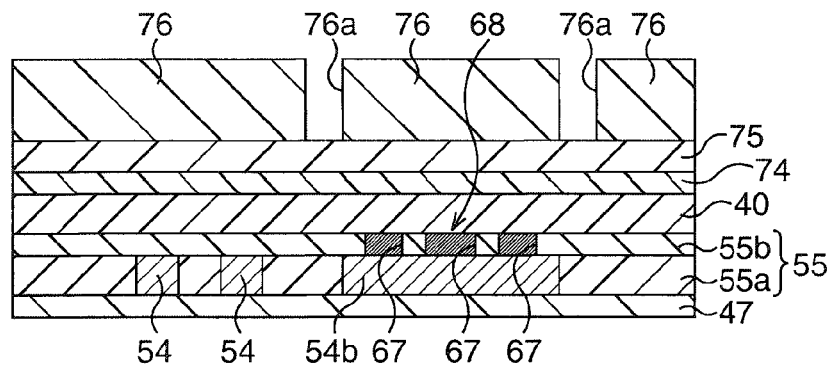
FIG. 14A is a schematic sectional view showing a process step of patterning a pad electrode and a protective film through a hard mask, as an alternative to FIG. 10F and FIG. 11A.

Next, as shown in FIG. 14A, a resist pattern 76 allowing therethrough process of the upper film 75 and the lower film 74 is formed.

More details, a resist is coated over the entire surface of the upper film 75, and the resist is then processed by lithography to thereby form the resist pattern 76 having a trench 76a allowing a part of the surface of the upper film 75 to expose therein, so as to leave the resist just as an island at a site aligned above the second interconnect 54b.

Figure 14B:
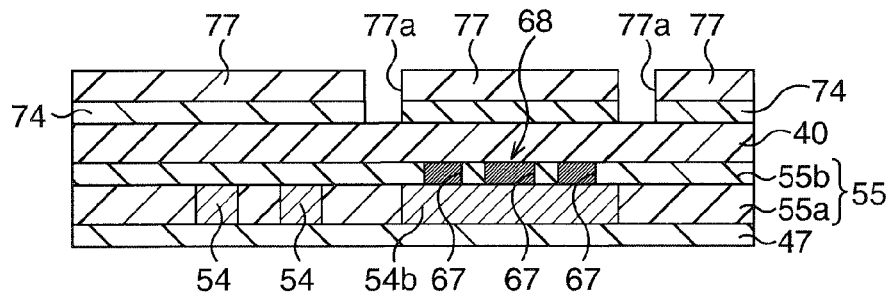
FIG. 14B is a schematic sectional view showing a process step of patterning a pad electrode and a protective film through a hard mask, as an alternative to FIG. 10F and FIG. 11A.

Next, as shown in FIG. 14B, the upper film 75 and lower film 74 are processed.

More details, the upper film 75 and the lower film 74 are dry etched through the resist pattern 76 used as a mask. By this process, a trench 77a allowing a part of the surface of the thin film 40 to expose therein is formed in the upper film 75 and the lower film 74, conforming to the geometry of the resist pattern 76, and thereby the hard mask 77 is completed.

Figure 14C:
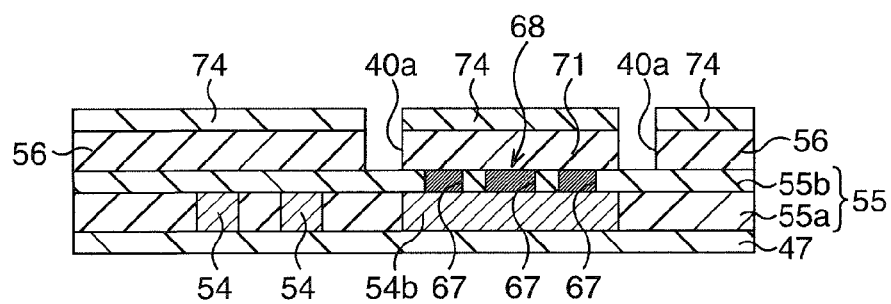
FIG. 14C is a schematic sectional view showing a process step of patterning a pad electrode and a protective film through a hard mask, as an alternative to FIG. 10F and FIG. 11A.

Next, as shown in FIG. 14C, the thin film 40 is processed.

More details, the thin film 40 is dry etched through the hard mask 77 used as a mask. Etching temperature herein elevated to 400° C. or above may degrade the ferroelectric capacitor structure 30, so that the etching is preferably proceeded at a temperature of 370° C. or around. In this process, the trench 40a allowing a part of the surface of the fourth insulating interlayer 55 to expose therein, conforming to the trench 77a of the hard mask 77, wherein the thin film 40 is disconnected by the trench 40a. Also the hard mask 77 is etched in the dry etching. The illustrated example shows the case where only the lower film 74 remains after the dry etching.

By the dry etching, the protective film 56 for blocking intrusion of water/hydrogen into the inside of the device, and the pad electrode 71 connected through the plugs 68 to the second interconnect 54b so as to establish electrical connection with the external, may be formed at the same time. The protective film 56 is formed so as to cover the entire portion above the silicon semiconductor substrate 10 excluding sites of formation of the pad electrode 71, so as to cover the periphery of the pad electrode 71, while being electrically isolated from the pad electrode 71.

Figure 14D:
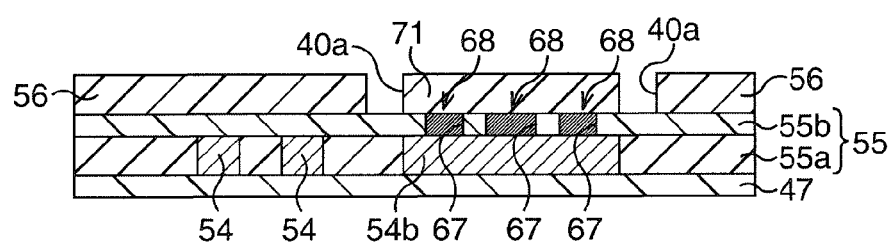
FIG. 14D is a schematic sectional view showing a process step of patterning a pad electrode and a protective film through a hard mask, as an alternative to FIG. 10F and FIG. 11A.

The hard mask 77 is then removed by wet etching using hydrofluoric acid or the like, as shown in FIG. 14D.

Thereafter, the FeRAM is completed after going through the individual process steps shown in FIG. 11B to FIG. 11D.

As has been described in the above, by using the hard mask 77, the thin film 40 may reliably be patterned even if the thin film 40 is a relatively thick film composed of a material containing a noble metal, and thereby the desired protective film 56 and the pad electrode 71 may be formed at the same time.

MODIFIED EXAMPLES

Paragraphs below will explain various Modified Examples of the second embodiment. In these Modified Examples, any constituents similar to those disclosed in the first embodiment will be given with the same reference numerals, and will not be detailed.

Modified Example 1

In this Example, in addition to the configuration of an FeRAM disclosed in the second embodiment, a protective film for preventing degradation of characteristics of the ferroelectric capacitor structure 30 is formed so as to cover the protective film 56 and the pad electrode 71.

FIG. 15 shows schematic sectional views expressing principal process steps in the method of fabricating an FeRAM according to Modified Example 1.

Figure 15A:
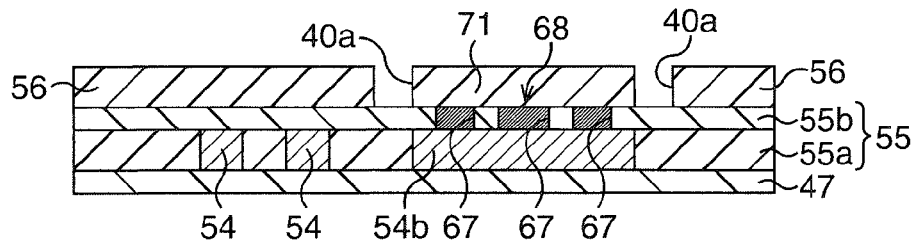
FIG. 15A is a schematic sectional view showing a method of manufacturing an FeRAM according to Modified Example 1 of the second embodiment.

First, similarly to as in the second embodiment, the MOS transistor 20, the ferroelectric capacitor structure 30, the first interconnects 45, the second interconnects 54, the protective film 56 and the pad electrode 71 disconnected from each other by the trench 40a, and so forth are formed according to the process steps shown in FIG. 1A to FIG. 1D, FIG. 2A to FIG. 2D, FIG. 3A, FIG. 3B, FIG. 4 (FIG. 5A), FIG. 10A to FIG. 10F and FIG. 11A. The state herein is shown in FIG. 15A (identical to FIG. 10G).

Figure 15B:
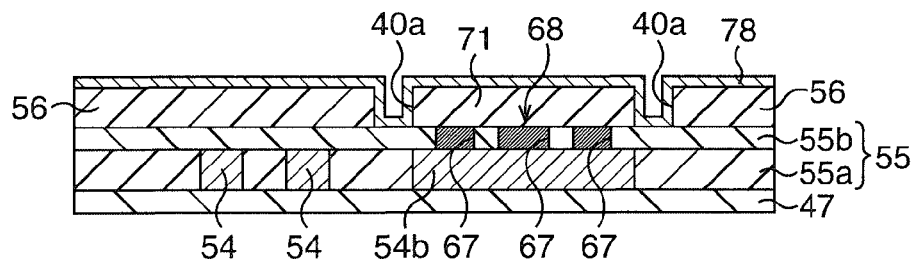
FIG. 15B is a schematic sectional view showing a method of manufacturing an FeRAM according to Modified Example 1 of the second embodiment.

Next, as shown in FIG. 15B, a protective film 78 for preventing degradation in characteristics of the ferroelectric capacitor structure 30 is formed so as to cover the protective film 56 including the inner wall surface of the trench 40a and so as to cover the pad electrode 71. As the protective film 78, a metal oxide film is formed by sputtering typically using alumina as a material, to as thick as 20 nm or around.

Figure 15C:
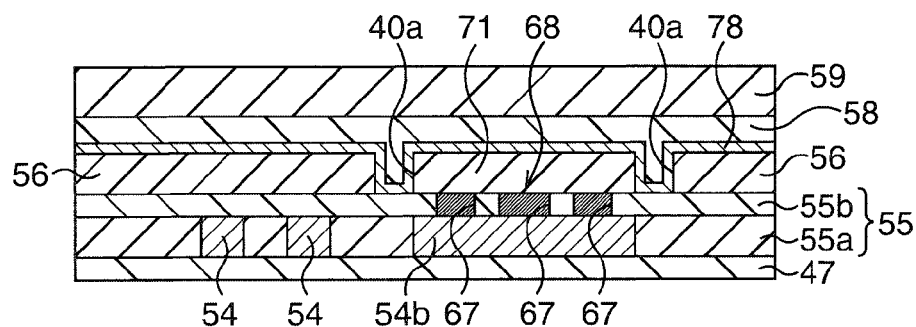
FIG. 15C is a schematic sectional view showing a method of manufacturing an FeRAM according to Modified Example 1 of the second embodiment.

Next, as shown in FIG. 15C, the insulating film 58 and the upper protective film 59 are formed.

More details, a silicon oxide film, for example, is formed on the protective film 56 including inside of the trench 40a and on the pad electrode 71, while placing the protective film 78 in between, to as thick as 1500 nm or around, and surface of the silicon oxide film is planarized by CMP, and upper protective film 72 represented by a silicon nitride film, is then deposited on the insulating film 58 to as thick as 350 nm or around.

Figure 15D:
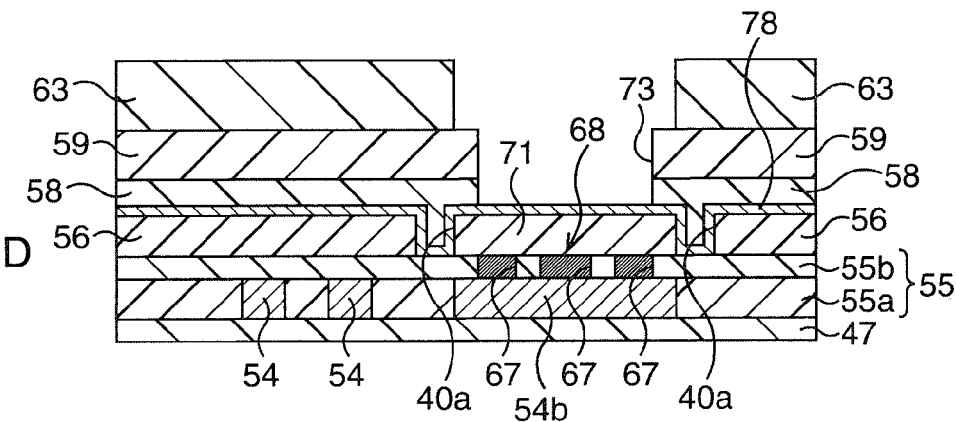
FIG. 15D is a schematic sectional view showing a method of fabricating an FeRAM according to Modified Example 1 of the second embodiment.

Thereafter, the FeRAM shown in FIG. 15D is completed after going through the individual process steps shown in FIG. 11C and FIG. 11D.

For the case where the protective film 56 and the pad electrode 71 are formed using palladium (Pd) or a palladium-containing material in Modified Example 1, the pad electrode 71 not only functions as a site of electrical connection, but also functions as blocking intrusion of water/hydrogen, in cooperation with the protective film 56. In other words, the protective film 56 and the pad electrode 71 consequently cover almost all regions possibly serve as the path of intrusion of water/hydrogen, so that hydrogen generated by the catalytic action may reliably be absorbed by the protective film 56 and the pad electrode 71, intrusion of water/hydrogen into the underlying second to fourth insulating interlayers 33, 47, 55 or the like may be blocked, and thereby high performance of the ferroelectric capacitor 30 may be maintained.

On the other hand, for the case where the protective film 56 and the pad electrode 71 are formed using iridium (Ir) or iridium oxide, or iridium (Ir)- or iridium-oxide-containing electro-conductive material in Modified Example 1, the pad electrode 71 not only functions as a site of electrical connection, but also functions as blocking intrusion of water/hydrogen, in cooperation with the protective film 56. In other words, the protective film 56 and the pad electrode 71 consequently cover almost all regions possibly serve as the path of intrusion of water/hydrogen, so that hydrogen generated by the catalytic action may reliably be absorbed by the protective film 56 and the pad electrode 71, intrusion of water/hydrogen into the underlying second to fourth insulating interlayers 33, 47, 55 or the like may be blocked, and thereby high performance of the ferroelectric capacitor 30 may be maintained.

In Modified Example 1, intrusion of water/hydrogen may further reliably be suppressed, by forming the protective film 78 composed of alumina so as to cover the protective film 56 and the pad electrode 71, in addition to the protective film 46 composed of alumina, together with the protective film 56 and the pad electrode 71.

As has been explained in the above, Modified Example 1 successfully realizes an FeRAM capable of reliably preventing water/hydrogen from entering inside only by a simple configuration, and of maintaining high performance of the ferroelectric capacitor structure 30.

Modified Example 2

In this Example, in addition to the configuration of FeRAM disclosed in the second embodiment, a protective film preventing degradation in characteristics of the ferroelectric capacitor structure 30 is formed in the trench 40a which disconnects the protective film 56 and the pad electrode 71.

FIG. 16 and FIG. 17 show schematic sectional views expressing principal process steps in the method of fabricating an FeRAM according to Modified Example 2.

Figure 16A:
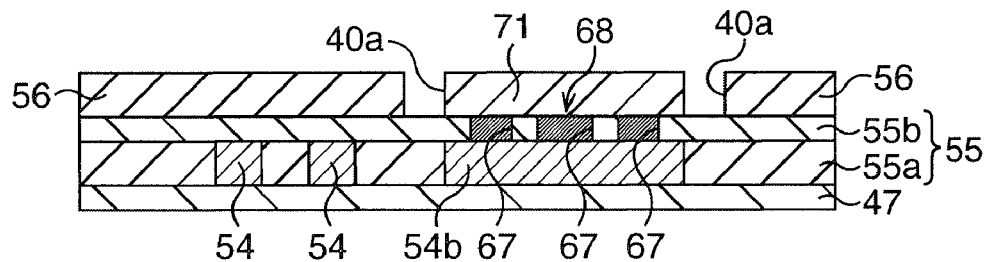
FIG. 16A is a schematic sectional view showing a method of manufacturing an FeRAM according to Modified Example 2 of the second embodiment.

First, similarly to as in the second embodiment, the MOS transistor 20, the ferroelectric capacitor structure 30, the first interconnects 45, the second interconnects 54, the protective film 56 and the pad electrode 71 disconnected from each other by the trench 40a, and so forth are formed according to the process steps shown in FIG. 1A to FIG. 1D, FIG. 2A to FIG. 2D, FIG. 3A, FIG. 3B, FIG. 4 (FIG. 5A), FIG. 10A to FIG. 10F and FIG. 11A. The state herein is shown in FIG. 16A (identical to FIG. 10G).

Figure 16B:
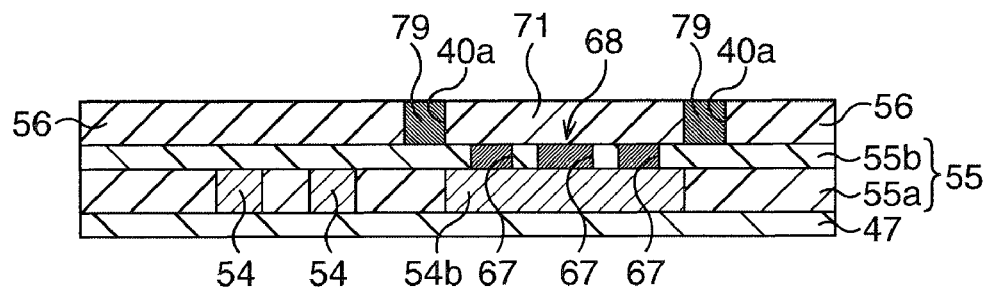
FIG. 16B is a schematic sectional view showing a method of manufacturing an FeRAM according to Modified Example 2 of the second embodiment.

Next, as shown in FIG. 16B, the trench 40a disconnecting the protective film 56 and the pad electrode 71 is filled with an insulating film 79.

More details, first, the insulating film 79 is formed so as to cover the protective film 56 and the pad electrode 71. As the insulating film 79, a silicon oxide film is deposited typically by CVD using TEOS. The surface of the insulating film 79 is then planarized by CMP, using the protective film 56 and the pad electrode 71 as stoppers.

Figure 16C:
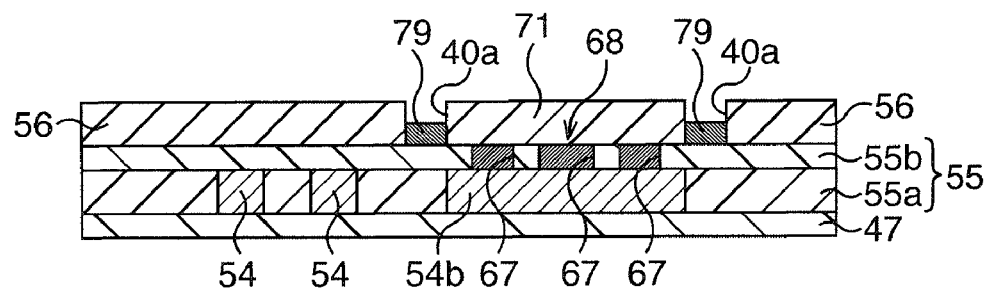
FIG. 16C is a schematic sectional view showing a method of manufacturing an FeRAM according to Modified Example 2 of the second embodiment.

Next, as shown in FIG. 16C, the surficial portion of the insulating film 79 filling up the trench 40a is selectively removed, to thereby expose the protective film 56 and the upper portion of the pad electrode 71. The surficial portion of the insulating film 79 herein is selectively removed typically by anisotropic etching over the entire surface, so-called etch-back.

Figure 16D:
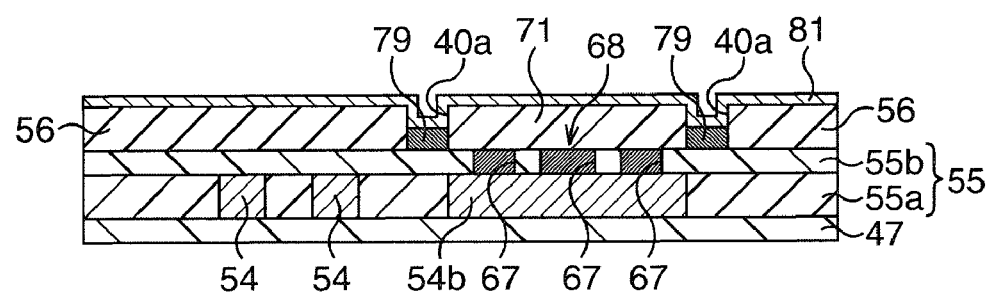
FIG. 16D is a schematic sectional view showing a method of manufacturing an FeRAM according to Modified Example 2 of the second embodiment.

Next, as shown in FIG. 16D, a protective film 81 preventing degradation in characteristics of the ferroelectric capacitor structure 30 is formed so as to cover the protective film 56 and the pad electrode 71, including the inner wall surface of the trench 40a above the insulating film 79. As the protective film 81, a metal oxide film is formed by sputtering typically using alumina as a material, to as thick as 20 nm or around.

Figure 17A:
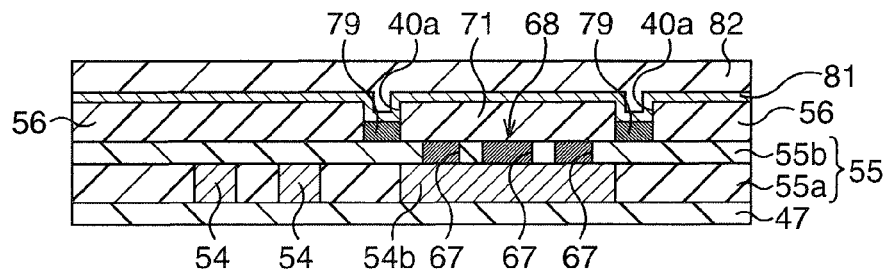
FIG. 17A is a schematic sectional view showing a method of manufacturing an FeRAM according to Modified Example 2 of the second embodiment.

Next, as shown in FIG. 17A, an insulating film 82 is formed on the protective film 81, so as to fill the trench 40a while placing the protective film 81. As the insulating film 82, a silicon oxide film is deposited typically by CVD using TEOS.

Figure 17B:
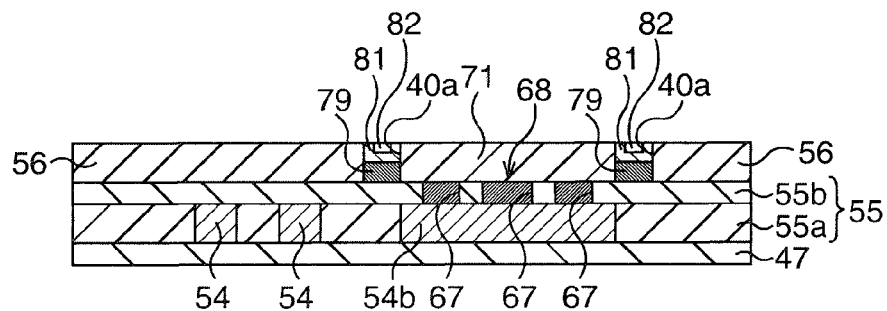
FIG. 17B is a schematic sectional view showing a method of manufacturing an FeRAM according to Modified Example 2 of the second embodiment.

Next, as shown in FIG. 17B, the insulating film 82 and the protective film 81 are polished by CMP, using the protective film 56 and the pad electrode 71 as stoppers. By this process, portions of the insulating film 82 and the protective film 81 which reside on the protective film 56 and pad electrode 71 are removed by polishing. As a consequence, only portions of the insulating film 82 and the protective film 81 filling up the trench 40a on the insulating film 79 remain. Because the inner space of the trench 40a, which provides a gap between the protective film 56 and the pad electrode 71, is thus filled up by the protective film 81, intrusion of water/hydrogen into the inside of the device may be prevented as possible.

Figure 17C:
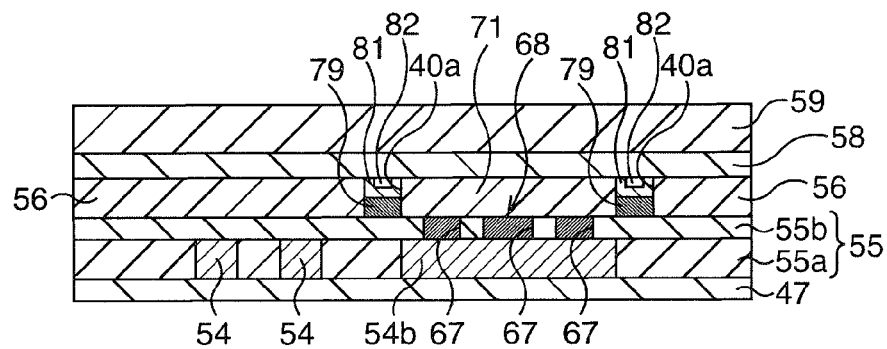
FIG. 17C is a schematic sectional view showing a method of manufacturing an FeRAM according to Modified Example 2 of the second embodiment.

Next, as shown in FIG. 17C, insulating film 58 and the upper protective film 59 are formed.

More details, the insulating film 58, exemplified by a silicon oxide film, is formed on the protective film 56 and the pad electrode 71 to as thick as 100 nm or around, and the upper protective film 59, exemplified by a silicon nitride film, is formed on the insulating film 58 to as thick as 350 nm or around.

Figure 17D:
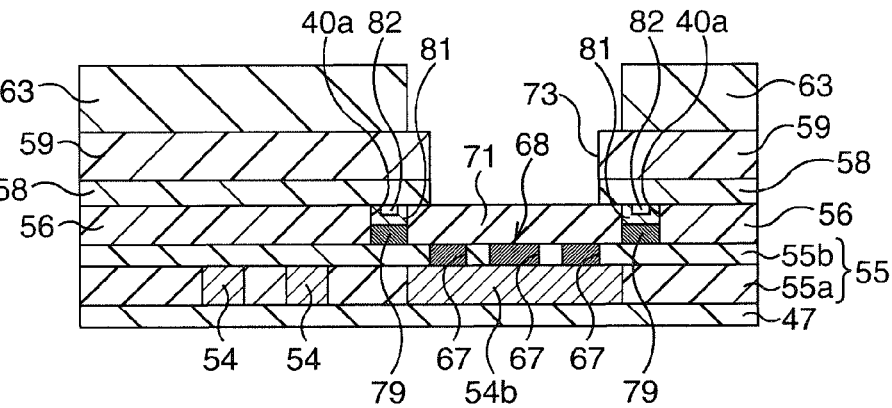
FIG. 17D is a schematic sectional view showing a method of manufacturing an FeRAM according to Modified Example 2 of the second embodiment.

Thereafter, the FeRAM shown in FIG. 17D is completed after going through the individual process steps shown in FIG. 11C and FIG. 11D.

For the case where the protective film 56 and the pad electrode 71 are formed using palladium (Pd) or a palladium-containing material in Modified Example 2, the pad electrode 71 not only functions as a site of electrical connection, but also functions as blocking intrusion of water/hydrogen, in cooperation with the protective film 56. In other words, the protective film 56 and the pad electrode 71 consequently cover almost all regions possibly serve as the path of intrusion of water/hydrogen, so that hydrogen generated by the catalytic action may reliably be absorbed by the protective film 56 and the pad electrode 71, intrusion of water/hydrogen into the underlying second to fourth insulating interlayers 33, 47, 55 or the like may be blocked, and thereby high performance of the ferroelectric capacitor 30 may be maintained.

On the other hand, for the case where the protective film 56 and the pad electrode 71 are formed using iridium (Ir) or iridium oxide, or iridium (Ir)- or iridium-oxide-containing electro-conductive material in Modified Example 2, the pad electrode 71 not only functions as a site of electrical connection, but also functions as blocking intrusion of water/hydrogen, in cooperation with the protective film 56. In other words, the protective film 56 and the pad electrode 71 consequently cover almost all regions possibly serve as the path of intrusion of water/hydrogen, so that hydrogen generated by the catalytic action may reliably be absorbed by the protective film 56 and the pad electrode 71, intrusion of water/hydrogen into the underlying second to fourth insulating interlayers 33, 47, 55 or the like may be blocked, and thereby high performance of the ferroelectric capacitor 30 may be maintained.

In Modified Example 2, intrusion of water/hydrogen may further reliably be suppressed, by forming the protective film 81 composed of alumina so as to fill up the trench 40a, which provides a gap between the protective film 56 and the pad electrode 71, in addition to the protective film 46 composed of alumina, together with the protective film 56 and the pad electrode 71.

As has been explained in the above, Modified Example 2 successfully realizes an FeRAM capable of reliably preventing water/hydrogen from entering inside only by a simple configuration, and of maintaining high performance of the ferroelectric capacitor structure 30.

Modified Example 3

In addition to the configuration of FeRAM disclosed in the second embodiment, this Modified Example has a protective film for preventing degradation in characteristics of the ferroelectric capacitor structure 30, formed under the protective film 56 and the pad electrode 71.

FIG. 18 and FIG. 19 show schematic sectional views expressing principal process steps in the method of fabricating an FeRAM according to Modified Example 3.

First, similarly to as in the second embodiment, the MOS transistor 20, the ferroelectric capacitor structure 30, the first interconnects 45, the second interconnects 54 and so forth are formed according to the process steps shown in FIG. 1A to FIG. 1D, FIG. 2A to FIG. 2D, FIG. 3A, FIG. 3B and FIG. 4 (FIG. 5A).

Figure 18A:
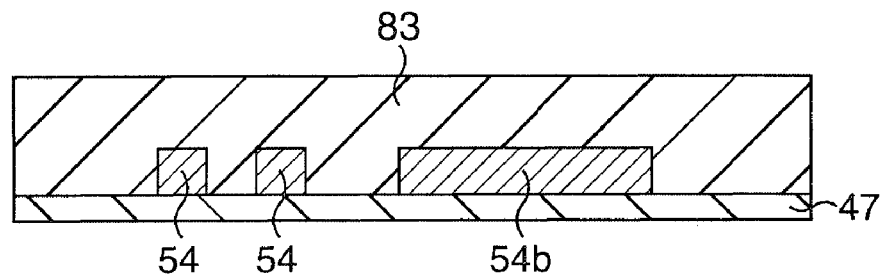
FIG. 18A is a schematic sectional view showing a method of manufacturing an FeRAM according to Modified Example 3 of the second embodiment.

Next, as shown in FIG. 18A, a fourth insulating interlayer 83 is formed so as to cover the second interconnects 54. As the fourth insulating interlayer 83, a silicon oxide film is formed typically by CVD using TEOS, to as thick as the second interconnects 54 are buried.

Figure 18B:
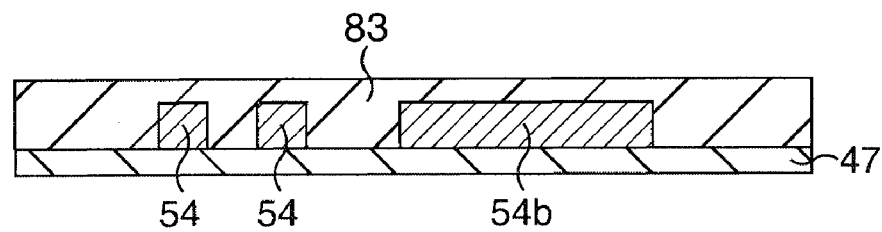
FIG. 18B is a schematic sectional view showing a method of manufacturing an FeRAM according to Modified Example 3 of the second embodiment.

Next, as shown in FIG. 18B, the surficial portion of the fourth insulating interlayer 83 is removed by CMP, to thereby planarize the surface. The fourth insulating interlayer 83 is then subjected to annealing in a $N_2$ atmosphere.

Figure 18C:
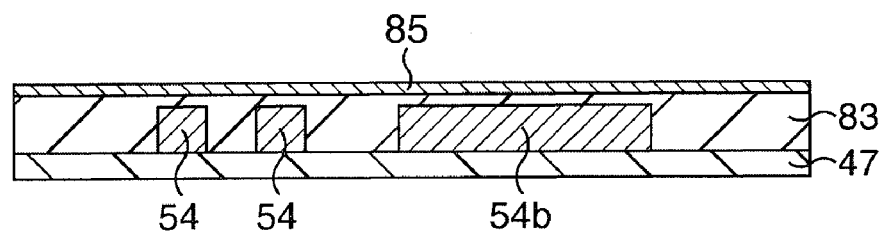
FIG. 18C is a schematic sectional view showing a method of manufacturing an FeRAM according to Modified Example 3 of the second embodiment.

Next, as shown in FIG. 18C, a protective film 85 for preventing degradation in characteristics of the ferroelectric capacitor structure 30 is formed on the planarized surface of the fourth insulating interlayer 83. As the protective film 85, a metal oxide film is formed by sputtering typically using alumina as a material, to as thick as 20 nm or around.

Figure 18D:
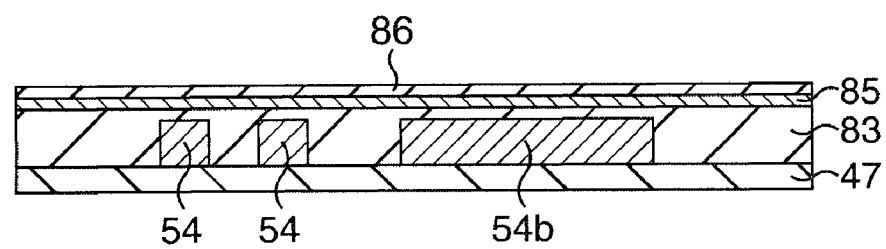
FIG. 18D is a schematic sectional view showing a method of manufacturing an FeRAM according to Modified Example 3 of the second embodiment.

Next, as shown in FIG. 18D, an insulating film 86 is formed on the protective film 85. As the insulating film 86, a silicon oxide film is formed typically by CVD using TEOS, to a thickness of 100 nm or around.

Figure 19A:
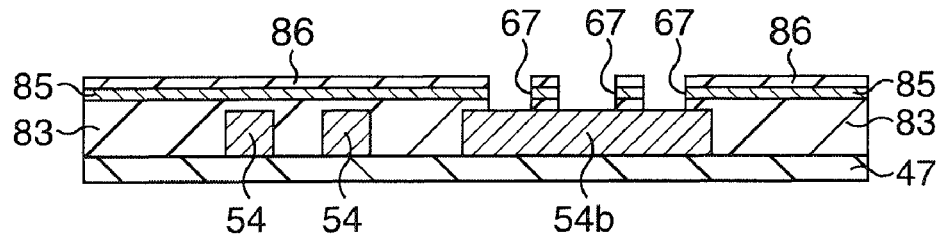
FIG. 19A is a schematic sectional view showing a method of manufacturing an FeRAM according to Modified Example 3 of the second embodiment.

Next, as shown in FIG. 19A, viaholes 67 are formed in the insulating film 86, the protective film 85 and the fourth insulating interlayer 83.

More details, the insulating film 86, the protective film 85 and the fourth insulating interlayer 83 are processed by lithography and the succeeding dry etching, to thereby form the viaholes 67 allowing parts of the surface of the second interconnect 54b to expose therein.

Figure 19B:
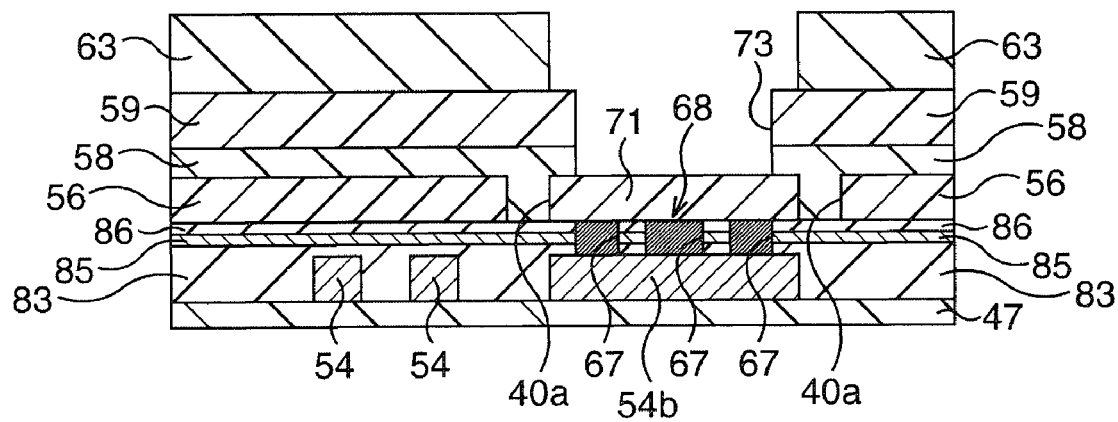
FIG. 19B is a schematic sectional view showing a method of manufacturing an FeRAM according to Modified Example 3 of the second embodiment.

Thereafter, the FeRAM shown in FIG. 19B is completed after going through the individual process steps shown in FIG. 10D to FIG. 10F, and FIG. 11A to FIG. 11D.

For the case where the protective film 56 and the pad electrode 71 are formed using palladium (Pd) or a palladium-containing material in Modified Example 3, the pad electrode 71 not only functions as a site of electrical connection, but also functions as blocking intrusion of water/hydrogen, in cooperation with the protective film 56. In other words, the protective film 56 and the pad electrode 71 consequently cover almost all regions possibly serve as the path of intrusion of water/hydrogen, so that hydrogen generated by the catalytic action may reliably be absorbed by the protective film 56 and the pad electrode 71, intrusion of water/hydrogen into the underlying second to fourth insulating interlayers 33, 47, 55 or the like may be blocked, and thereby high performance of the ferroelectric capacitor 30 may be maintained.

On the other hand, for the case where the protective film 56 and the pad electrode 71 are formed using iridium (Ir) or iridium oxide, or iridium (Ir)- or iridium-oxide-containing electro-conductive material in Modified Example 3, the pad electrode 71 not only functions as a site of electrical connection, but also functions as blocking intrusion of water/hydrogen, in cooperation with the protective film 56. In other words, the protective film 56 and the pad electrode 71 consequently cover almost all regions possibly serve as the path of intrusion of water/hydrogen, so that hydrogen generated by the catalytic action may reliably be absorbed by the protective film 56 and the pad electrode 71, intrusion of water/hydrogen into the underlying second to fourth insulating interlayers 33, 47, 55 or the like may be blocked, and thereby high performance of the ferroelectric capacitor 30 may be maintained.

In Modified Example 3, intrusion of water/hydrogen may further reliably be suppressed, by forming the protective film 85 composed of alumina under the pad electrode 71 and the protective film 56, in addition to the protective film 46 composed of alumina, together with the protective film 56 and the pad electrode 71.

As has been explained in the above, Modified Example 3 successfully realizes an FeRAM capable of reliably preventing water/hydrogen from entering inside only by a simple configuration, and of maintaining high performance of the ferroelectric capacitor structure 30.

Modified Example 4

In addition to the configuration of FeRAM disclosed in the second embodiment, this Modified Example has a protective film for preventing degradation in characteristics of the ferroelectric capacitor structure 30, formed on the protective film 56 and the pad electrode 71.

FIG. 20 and FIG. 21 show schematic sectional views expressing principal process steps in the method of fabricating an FeRAM according to Modified Example 4.

Figure 20A:
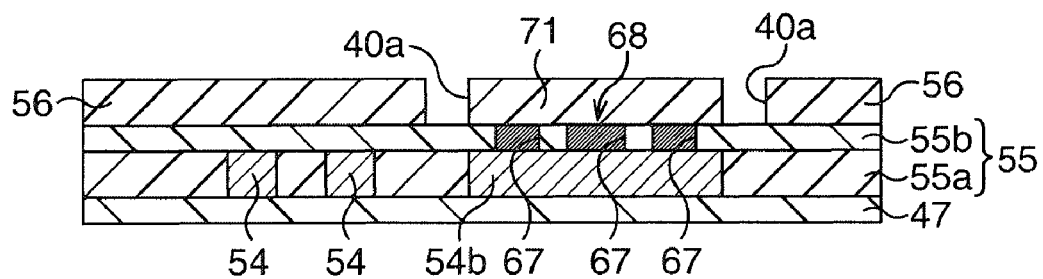
FIG. 20A is a schematic sectional view showing a method of manufacturing an FeRAM according to Modified Example 4 of the second embodiment.

First, similarly to as in the second embodiment, the MOS transistor 20, the ferroelectric capacitor structure 30, the first interconnects 45, the second interconnects 54, the protective film 56 and the pad electrode 71 disconnected from each other by the trench 40a, and so forth are formed according to the process steps shown in FIG. 1A to FIG. 1D, FIG. 2A to FIG. 2D, FIG. 3A, FIG. 3B, FIG. 4 (FIG. 5A), FIG. 10A to FIG. 10F and FIG. 11A. The state herein is shown in FIG. 20A (identical to FIG. 10G).

Figure 20B:
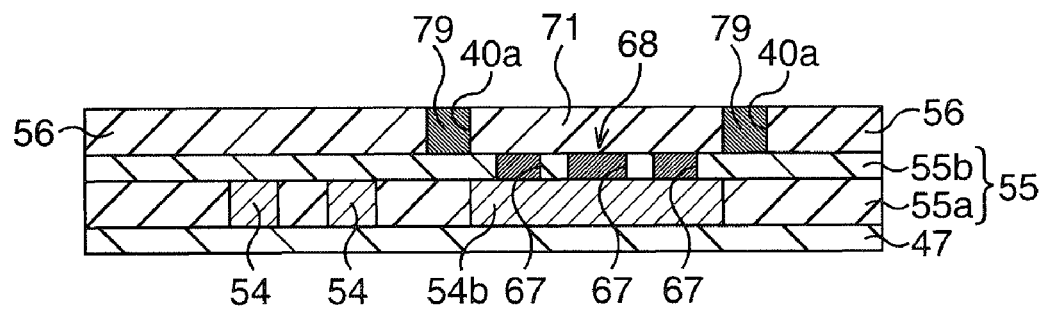
FIG. 20B is a schematic sectional view showing a method of manufacturing an FeRAM according to Modified Example 4 of the second embodiment.

Next, as shown in FIG. 20B, the trench 40a disconnecting the protective film 56 and the pad electrode 71 from each other is filled with the insulating film 79.

More details, first an insulating film 79 is formed so as to cover the protective film 56 and the pad electrode 71. As the insulating film 79, a silicon oxide film is formed typically by CVD using TEOS. Then the surface of the insulating film 79 is planarized by CMP, using the protective film 56 and the pad electrode 71 as stoppers.

Figure 20C:
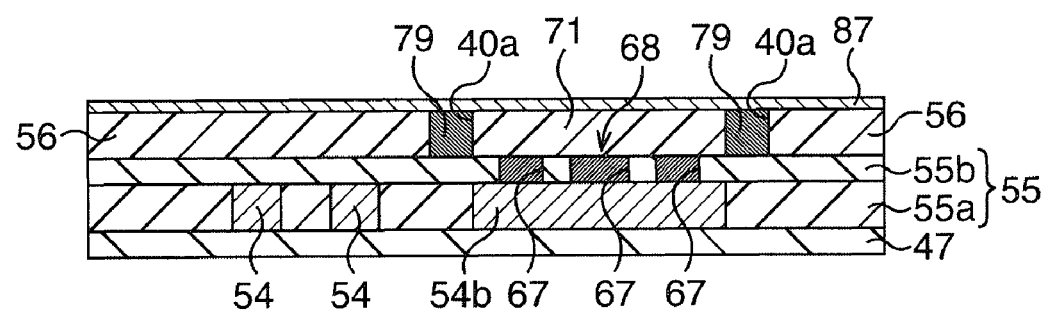
FIG. 20C is a schematic sectional view showing a method of manufacturing an FeRAM according to Modified Example 4 of the second embodiment.

Next, as shown in FIG. 20C, a protective film 87 for preventing degradation in characteristics of the ferroelectric capacitor structure 30 is formed on the protective film 56, the pad electrode 71, and the insulating film 79. As the protective film 87, a metal oxide film is formed typically by sputtering using alumina as a material, to as thick as 20 nm or around.

Figure 21A:
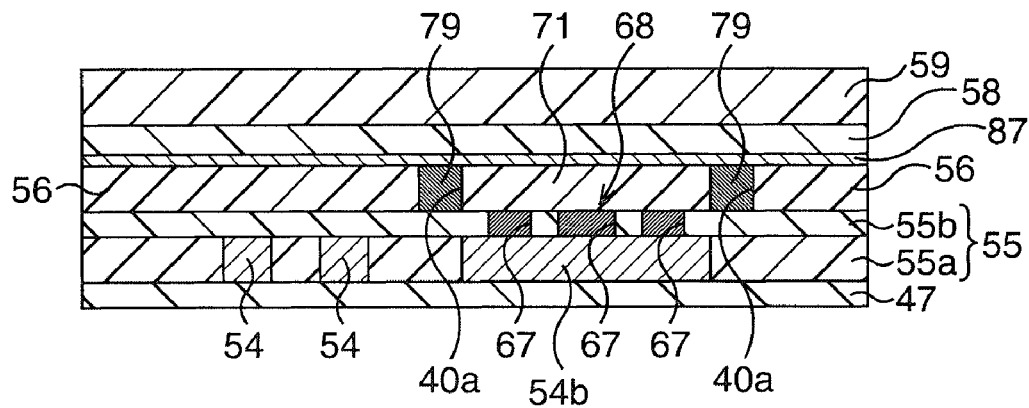
FIG. 21A is a schematic sectional view showing a method of manufacturing an FeRAM according to Modified Example 4 of the second embodiment.

Next, as shown in FIG. 21A, the insulating film 58 and the upper protective film 59 are formed.

More details, the insulating film 58, exemplified by a silicon oxide film, is deposited on the protective film 87 to as thick as 100 nm or around, and the upper protective film 72, exemplified by a silicon nitride film, is then formed on the insulating film 58 to as thick as 350 nm or around.

Figure 21B:
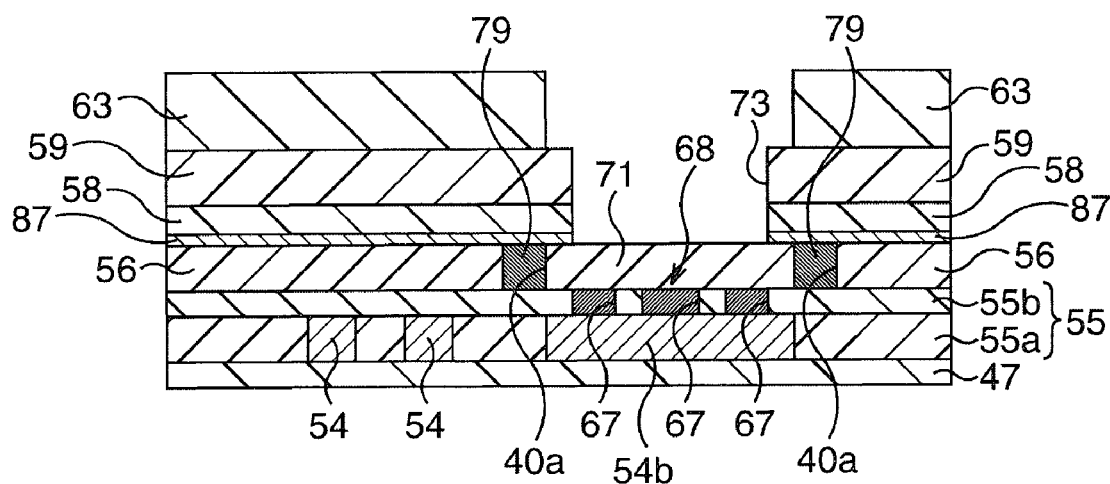
FIG. 21B is a schematic sectional view showing a method of manufacturing an FeRAM according to Modified Example 4 of the second embodiment.

Thereafter, the FeRAM shown in FIG. 21B is completed after going through the individual process steps shown in FIG. 11C and FIG. 11D.

For the case where the protective film 56 and the pad electrode 71 are formed using palladium (Pd) or a palladium-containing material in Modified Example 4, the pad electrode 71 not only functions as a site of electrical connection, but also functions as blocking intrusion of water/hydrogen, in cooperation with the protective film 56. In other words, the protective film 56 and the pad electrode 71 consequently cover almost all regions possibly serve as the path of intrusion of water/hydrogen, so that hydrogen generated by the catalytic action may reliably be absorbed by the protective film 56 and the pad electrode 71, intrusion of water/hydrogen into the underlying second to fourth insulating interlayers 33, 47, 55 or the like may be blocked, and thereby high performance of the ferroelectric capacitor 30 may be maintained.

On the other hand, for the case where the protective film 56 and the pad electrode 71 are formed using iridium (Ir) or iridium oxide, or iridium (Ir)- or iridium-oxide-containing electro-conductive material in Modified Example 4, the pad electrode 71 not only functions as a site of electrical connection, but also functions as blocking intrusion of water/hydrogen, in cooperation with the protective film 56. In other words, the protective film 56 and the pad electrode 71 consequently cover almost all regions possibly serve as the path of intrusion of water/hydrogen, so that hydrogen generated by the catalytic action may reliably be absorbed by the protective film 56 and the pad electrode 71, intrusion of water/hydrogen into the underlying second to fourth insulating interlayers 33, 47, 55 or the like may be blocked, and thereby high performance of the ferroelectric capacitor 30 may be maintained.

In Modified Example 4, intrusion of water/hydrogen may further reliably be suppressed, by forming the protective film 87 composed of alumina on the pad electrode 71 and the protective film 56, in addition to the protective film 46 composed of alumina, together with the protective film 56 and the pad electrode 71.

As has been explained in the above, Modified Example 4 successfully realizes an FeRAM capable of reliably preventing water/hydrogen from entering inside only by a simple configuration, and of maintaining high performance of the ferroelectric capacitor structure 30.

Modified Example 5

In the Modified Example, the thin film 40 in the configuration of FeRAM disclosed in the second embodiment, aimed at forming the protective film 56 and the pad electrode 71, is formed as a multi-layered structure.

FIG. 22 shows schematic sectional views of exemplary configurations of a thin film which is processed to give the protective film and the pad electrode in Modified Example 5.

In the process steps of fabricating an FeRAM, it is necessary to bring a probe into contact (probe contact) with the pad electrode 71 after being formed for functional inspection. The probe contact may sometimes be causative of a mark on the surface of the pad electrode 71. In order to ensure sufficient levels of electro-conductivity of the pad electrode 71 and contact performance with the interconnect even after the mark is formed, the pad electrode 71 is necessarily formed to a certain level of thickness, typically to as thick as 600 nm or around. On the other hand, the protective film 56 only as thin as 1 nm to 20 nm may be sufficient for blocking of water/hydrogen, wherein increase in the thickness raises a need of forming a hard mask or the like for patterning.

Therefore in Modified Example 5, the thin film 40 to be processed into the protective film 56 and the pad electrode 71 is formed as a multi-layered film containing a plurality of electro-conductive layers having at least one film containing palladium (Pd) or iridium (Ir) or iridium oxide.

In Modified Example 5, the thin film 40 is formed, in the process step shown in FIG. 10E, as the multi-layered structures as described in Specific Examples 1 to 11. The other process steps are same as those in the second embodiment.

Specific Example 1

Figure 22A:
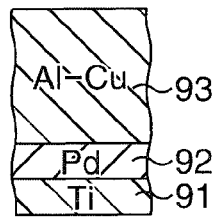
FIG. 22A is a schematic sectional view showing a method of manufacturing an FeRAM according to Modified Example 5 of the second embodiment.

As shown in FIG. 22A, a Ti film 91, a Pd film 92 and Al—Cu alloy film 93 are sequentially deposited typically by sputtering, to thereby configure the thin film 40 by the multi-layered film. The Ti film 91 herein is deposited to a thickness of approximately 10 nm, the Pd film 92 to a thickness of 1 nm to 20 nm, typically 20 nm or around herein, and the Al—Cu alloy film 93 to approximately 570 nm. In place of the Pd film 92, it is also allowable herein to use any films composed of any materials of the embodiment other than those described in the above, such as a palladium (Pd)-containing electro-conductive material, iridium (Ir) or iridium oxide, or iridium (Ir)- or iridium-oxide-containing electro-conductive material. The same will apply also to Specific Examples 2 to 11 below.

Specific Example 2

Figure 22B:
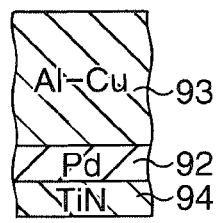
FIG. 22B is a schematic sectional view showing a method of manufacturing an FeRAM according to Modified Example 5 of the second embodiment.

As shown in FIG. 22B, a TiN film 94, the Pd film 92 and the Al—Cu alloy film 93 are sequentially deposited typically by sputtering, to thereby configure the thin film 40 by the multi-layered film. The TiN film 94 herein is deposited to a thickness of approximately 100 nm, the Pd film 92 to a thickness of 1 nm to 20 nm, typically 20 nm or around herein, and the Al—Cu alloy film 93 to approximately 480 nm.

Specific Example 3

Figure 22C:
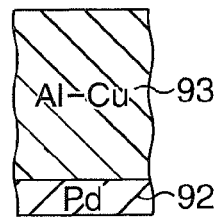
FIG. 22C is a schematic sectional view showing a method of manufacturing an FeRAM according to Modified Example 5 of the second embodiment.

As shown in FIG. 22C, the Pd film 92 and the Al—Cu alloy film 93 are sequentially deposited typically by sputtering, to thereby configure the thin film 40 by the multi-layered film. The Pd film 92 herein is deposited to a thickness of 1 nm to 20 nm, typically 20 nm or around herein, and the Al—Cu alloy film 93 to approximately 580 nm.

Specific Example 4

Figure 22D:
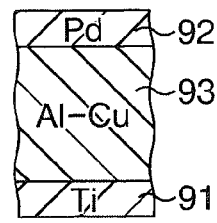
FIG. 22D is a schematic sectional view showing a method of manufacturing an FeRAM according to Modified Example 5 of the second embodiment.

As shown in FIG. 22D, the Ti film 91, the Al—Cu alloy film 93 and the Pd film 92 are sequentially deposited typically by sputtering, to thereby configure the thin film 40 by the multi-layered film. The Ti film 91 herein is deposited to a thickness of approximately 10 nm, the Al—Cu alloy film 93 to approximately 570 nm, and the Pd film 92 to a thickness of 1 nm to 20 nm, typically 20 nm or around herein.

Specific Example 5

Figure 22E:
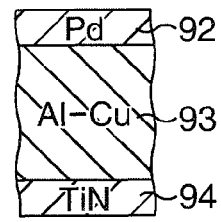
FIG. 22E is a schematic sectional view showing a method of manufacturing an FeRAM according to Modified Example 5 of the second embodiment.

As shown in FIG. 22E, the TiN film 94, the Al—Cu alloy film 93 and the Pd film 92 are sequentially deposited typically by sputtering, to thereby form the thin film 40 by the multi-layered film. The TiN film 94 herein is deposited to a thickness of approximately 100 nm, the Al—Cu alloy film 93 to approximately 480 nm, an the Pd film 92 to a thickness of 1 nm to 20 nm, typically 20 nm or around herein.

Specific Example 6

Figure 22F:
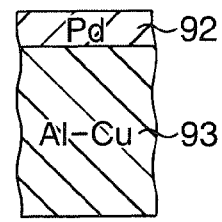
FIG. 22F is a schematic sectional view showing a method of manufacturing an FeRAM according to Modified Example 5 of the second embodiment.

As shown in FIG. 22F, the Al—Cu alloy film 93 and the Pd film 92 are sequentially deposited typically by sputtering, to thereby form the thin film 40 by the multi-layered film. The Al—Cu alloy film 93 herein is deposited to a thickness of approximately 580 nm, and the Pd film 92 to a thickness of 1 nm to 20 nm, typically 20 nm or around herein.

Specific Example 7

Figure 22G:
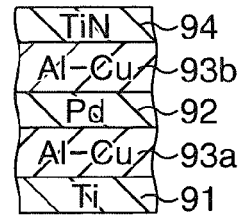
FIG. 22G is a schematic sectional view showing a method of manufacturing an FeRAM according to Modified Example 5 of the second embodiment.

As shown in FIG. 22G, the Ti film 91, an Al—Cu alloy film 93a, the Pd film 92, an Al—Cu alloy film 93b, and the TiN film 94 are sequentially deposited typically by sputtering, to thereby configure the thin film 40 by the multi-layered film. The Ti film 91 herein is deposited to a thickness of approximately 10 nm, the Al—Cu alloy film 93a to approximately 170 nm, the Pd film 92 to a thickness of 1 nm to 20 nm, typically 20 nm or around herein, the Al—Cu alloy film 93b to approximately 200 nm, and the TiN film 94 to approximately 100 nm.

Specific Example 8

Figure 22H:
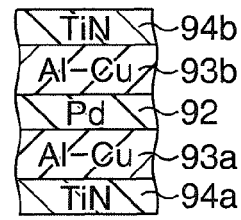
FIG. 22H is a schematic sectional view showing a method of manufacturing an FeRAM according to Modified Example 5 of the second embodiment.

As shown in FIG. 22H, a TiN film 94a, the Al—Cu alloy film 93a, the Pd film 92, the Al—Cu alloy film 93b, and a TiN film 94b are sequentially deposited typically by sputtering, to thereby configure the thin film 40 by the multi-layered film. The TiN film 94a herein is deposited to a thickness of approximately 100 nm, the Al—Cu alloy film 93a to approximately 100 nm, the Pd film 92 to a thickness of 1 nm to 20 nm, typically 20 nm or around herein, the Al—Cu alloy film 93b to approximately 280 nm, and the TiN film 94b to approximately 100 nm.

Specific Example 9

Figure 22I:
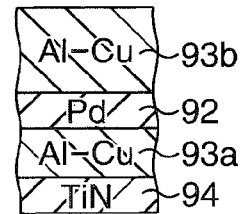
FIG. 22I is a schematic sectional view showing a method of manufacturing an FeRAM according to Modified Example 5 of the second embodiment.

As shown in FIG. 22I, the TiN film 94, the Al—Cu alloy film 93a, the Pd film 92, and the Al—Cu alloy film 93b are sequentially deposited typically by sputtering, to thereby configure the thin film 40 by the multi-layered film. The TiN film 94 herein is deposited to a thickness of approximately 100 nm, the Al—Cu alloy film 93a to approximately 100 nm, the Pd film 92 to a thickness of 1 nm to 20 nm, typically 20 nm or around herein, and the Al—Cu alloy film 93b to approximately 380 nm.

Specific Example 10

Figure 22J:
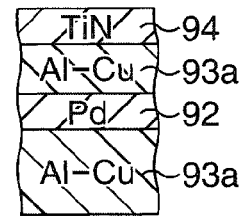
FIG. 22J is a schematic sectional view showing a method of manufacturing an FeRAM according to Modified Example 5 of the second embodiment.

As shown in FIG. 22J, the Al—Cu alloy film 93a, the Pd film 92, the Al—Cu alloy film 93b, and the TiN film 94 are sequentially deposited typically by sputtering, to thereby configure the thin film 40 by the multi-layered film. The Al—Cu alloy film 93a herein is deposited to a thickness of approximately 100 nm, the Pd film 92 to a thickness of 1 nm to 20 nm, typically 20 nm or around herein, the Al—Cu alloy film 93b to approximately 380 nm, and the TiN film 94 to approximately 100 nm.

Specific Example 11

Figure 22K:
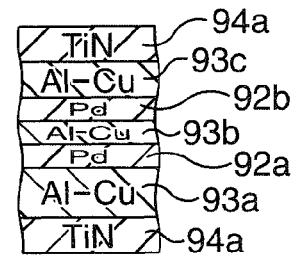
FIG. 22K is a schematic sectional view showing a method of manufacturing an FeRAM according to Modified Example 5 of the second embodiment.

As shown in FIG. 22K, the TiN film 94a, the Al—Cu alloy film 93a, the Pd film 92a, the Al—Cu alloy film 93b, the Pd film 92b, the Al—Cu alloy film 93c, and the TiN film 94b are sequentially deposited typically by sputtering, to thereby configure the thin film 40 by the multi-layered film. The TiN film 94a herein is deposited to a thickness of approximately 50 nm, each of the Al—Cu alloy films 93a, 93b, 93c to approximately 150 nm, and the TiN film 94b to approximately 50 nm. The Pd films 92a, 92b are deposited so as to adjust the total thickness to 1 nm to 20 nm, wherein the Pd film 92a is formed to a thickness of approximately 10 nm, and the Pd film 92b to approximately 10 nm.

According to the thin film 40 having any of these multi-layered structures, the function of blocking water/hydrogen may be realized by the film composed of the materials of the embodiment, which are the Pd film 92 (or 92a and 92b) in Examples in the above, and the electro-conductivity of the pad electrode 71 and contact performance with the interconnect may be realized by the other electro-conductive layers, which are the Ti film 91, the TiN film 94 (or 94a and 94b), and the Al—Cu alloy film 93 (or 93a, 93b and 93c). Because the thin film 40 in this case is not a single-layered film of palladium (Pd), iridium (Ir) or iridium oxide, the protective film 56 and the pad electrode 71 may be patterned without using a hard mask or the like, even if the thin film 40 is formed to as thick as 20 nm or above.

As has been explained in the above, Modified Example 5 successfully realizes an FeRAM capable of reliably preventing water/hydrogen from entering inside only by a simple configuration, and of maintaining high performance of the ferroelectric capacitor structure 30.

INDUSTRIAL APPLICABILITY

The embodiment successfully realizes an FeRAM capable of reliably preventing water/hydrogen from entering inside only by a simple configuration, and of maintaining high performance of the capacitor structure, in particular ferroelectric capacitor structure.

What is claimed is:
1. A semiconductor device comprising:
a semiconductor substrate;
a capacitor structure formed over said semiconductor substrate, and having a dielectric film held between a lower electrode and an upper electrode;
an interconnect structure formed over said capacitor structure, and electrically connected to said capacitor structure; and
a pad electrode electrically connected to said interconnect structure so as to establish electrical connection with externals;
wherein a protective film composed of a palladium-containing material is formed so as to cover the periphery of said pad electrode, while being electrically isolated from said pad electrode, and wherein said pad electrode and said protective film are formed in the same level, are composed of the same material and have the same film thickness.

2. The semiconductor device according to claim 1, wherein said protective film is formed so as to cover the entire range over said semiconductor substrate excluding a site of formation of said pad electrode.

3. The semiconductor device according to claim 1, wherein said dielectric film is composed of a ferroelectric material having a ferroelectric characteristic.

4. The semiconductor device according to claim 1, further comprising a silicon nitride film formed over said protective film, wherein said silicon nitride film is formed so as to cover the inner wall surface of a contact hole of said pad electrode.

5. A semiconductor device comprising:
   a semiconductor substrate;
   a capacitor structure formed over said semiconductor substrate, and having a dielectric film held between a lower electrode and an upper electrode;
   an interconnect structure formed over said capacitor structure, and electrically connected to said capacitor structure; and
   a pad electrode electrically connected to said interconnect structure so as to establish electrical connection with externals;
   wherein a protective film composed of an iridium- or iridium oxide-containing material is formed so as to cover the periphery of said pad electrode, while being electrically isolated from said pad electrode, and
   wherein said pad electrode and said protective film are formed in the same level, are composed of the same material and have the same film thickness.

6. The semiconductor device according to claim 5, wherein said protective film is formed so as to cover the entire range over said semiconductor substrate excluding a site of formation of said pad electrode.

7. The semiconductor device according to claim 5, wherein said dielectric film is composed of a ferroelectric material having a ferroelectric characteristic.

8. The semiconductor device according to claim 5, further comprising a silicon nitride film formed over said protective film, wherein said silicon nitride film is formed so as to cover the inner wall surface of a contact hole of said pad electrode.

9. A method of manufacturing a semiconductor device comprising:
   forming, over a semiconductor substrate, a capacitor structure having a dielectric film held between a lower electrode and an upper electrode;
   forming an insulating film over said capacitor structure;
   forming an interconnect structure in the insulating film as being electrically connected to said capacitor structure;
   forming a palladium-containing layer on the insulating film and on the interconnect structure; and
   patterning the palladium-containing layer to form a pad electrode and a protective film, the pad electrode connects to said interconnect structured, and the protective film covers the periphery of said pad electrode, while being electrically isolated from said pad electrode.

10. The method of manufacturing a semiconductor device according to claim 9, wherein said protective film is formed so as to cover the entire range over said semiconductor substrate excluding a site of formation of said pad electrode.

11. The method of manufacturing a semiconductor device according to claim 9, wherein said dielectric film is formed using a ferroelectric material having a ferroelectric characteristic.

12. A method of manufacturing a semiconductor device comprising:
   forming, over a semiconductor substrate, a capacitor structure having a dielectric film held between a lower electrode and an upper electrode;
   forming an insulating film over said capacitor structure;
   forming an interconnect structure in the insulating film as being electrically connected to said capacitor structure;
   forming an iridium- or iridium oxide-containing layer on the insulating film and on the interconnect structure; and
   patterning the iridium- or iridium oxide-containing layer to form a pad electrode and a protective film, the pad electrode connects to said interconnect structure, and the protective film covers the periphery of said pad electrode, while being electrically isolated from said pad electrode.

13. The method of manufacturing a semiconductor device according to claim 12, wherein said protective film is formed so as to cover the entire range over said semiconductor substrate excluding a site of formation of said pad electrode.

14. The method of manufacturing a semiconductor device according to claim 12, wherein said dielectric film is formed using a ferroelectric material having a ferroelectric characteristic.

* * * * *